US012676461B2

(12) United States Patent
Rossetti et al.

(10) Patent No.: US 12,676,461 B2
(45) Date of Patent: Jul. 7, 2026

(54) MONOLITHIC EDGE-EMITTING SEMICONDUCTOR DIODE ARRAYS

(71) Applicant: EXALOS AG, Schlieren (CH)

(72) Inventors: Marco Rossetti, Schlieren (CH); Marcus Dülk, Schlieren (CH); Antonino Francesco Castiglia, Schlieren (CH); Marco Malinverni, Schlieren (CH); Christian Velez, Schlieren (CH)

(73) Assignee: EXALOS AG, Schlieren (CH)

( * ) Notice: Subject to any disclaimer, the term of this patent is extended or adjusted under 35 U.S.C. 154(b) by 735 days.

(21) Appl. No.: 18/064,244

(22) Filed: Dec. 9, 2022

(65) Prior Publication Data

US 2023/0261444 A1 Aug. 17, 2023

(30) Foreign Application Priority Data

Feb. 17, 2022 (GB) ..................................... 2202159

(51) Int. Cl.
*H01S 5/40* (2006.01)
*H01S 5/02* (2006.01)
(Continued)

(52) U.S. Cl.
CPC .......... *H01S 5/4031* (2013.01); *H01S 5/0203* (2013.01); *H01S 5/022* (2013.01);
(Continued)

(58) Field of Classification Search
CPC ........ H01S 5/4031; H01S 5/0203; H01S 5/22; H01S 5/026; H01S 5/101; H01S 5/1085;
(Continued)

(56) References Cited

U.S. PATENT DOCUMENTS

| | | | |
|---|---|---|---|
| 4,916,710 A | 4/1990 | Hattori | |
| 4,977,570 A | 12/1990 | Hasegawa | |
| | (Continued) | | |

FOREIGN PATENT DOCUMENTS

| | | |
|---|---|---|
| JP | 61168283 | 7/1986 |
| JP | 2000252592 A | 9/2000 |
| | (Continued) | |

*Primary Examiner* — Jessica S Manno

(74) *Attorney, Agent, or Firm* — Nemphos Braue LLC; Michael Antone

(57) ABSTRACT

A monolithic edge-emitting semiconductor diode array chip (100) comprises a one-dimensional array (70) of diode emitters (50), such as laser diodes, superluminescent diodes or semiconductor optical amplifiers. Semiconductor layers are arranged on a conductive substrate (1) and include active region layers (14) arranged between upper and lower cladding layers (12, 16) and separation layers (4, 5) arranged between the conductive substrate (1) and the lower cladding layer (16). The diode emitters (50) are formed by respective ridges (9) that are separated by trenches (25) which are sufficiently deep to penetrate into the separation layers (4, 5). Each diode (50) has its own upper and lower contacts (22, 24) that allow each diode (50) to be independently drivable with a current source driver circuit connected to push a modulated push current through its associated diode and/or a current sink connected to extract a modulated pull current through its associated diode.

17 Claims, 15 Drawing Sheets

(51) Int. Cl.
  *H01S 5/022* (2021.01)
  *H01S 5/026* (2006.01)
  *H01S 5/10* (2021.01)
(52) U.S. Cl.
  CPC .............. *H01S 5/026* (2013.01); *H01S 5/101* (2013.01); *H01S 5/1085* (2013.01)
(58) Field of Classification Search
  CPC ........ H01S 5/022; H01S 5/005; H01S 5/0425; H01S 5/1003; H01S 5/4025; H01S 5/0422; H01S 5/0261; H01S 5/04256; H01S 5/062; G02B 6/125; G02B 2006/12147; G02B 6/12002; G02B 6/12004; G02B 27/0172; G02B 2006/12097; H10H 20/83
  See application file for complete search history.

(56) References Cited

U.S. PATENT DOCUMENTS

| | | | |
|---|---|---|---|
| 5,259,049 A | 11/1993 | Bona et al. | |
| 5,887,012 A | 3/1999 | Yamada | |
| 6,058,124 A * | 5/2000 | Sun ...................... | H01S 5/4031 |
| | | | 372/50.122 |
| 6,744,800 B1 * | 6/2004 | Kneissl ............... | H01L 21/2007 |
| | | | 372/50.1 |
| 6,816,528 B1 * | 11/2004 | Kneissl ............... | H01S 5/32341 |
| | | | 372/50.1 |
| 7,315,560 B2 | 1/2008 | Lewis et al. | |
| 2004/0105471 A1 | 6/2004 | Kneissl et al. | |
| 2004/0206975 A1 | 10/2004 | Tojo et al. | |
| 2007/0237200 A1 | 10/2007 | Ryu et al. | |
| 2010/0111129 A1 | 5/2010 | Nakashima et al. | |
| 2010/0329295 A1 | 12/2010 | Nakashima et al. | |
| 2013/0156056 A1 | 6/2013 | Moto | |
| 2017/0123172 A1 | 5/2017 | Adachi et al. | |
| 2018/0034243 A1 | 2/2018 | Kelemen et al. | |
| 2019/0229492 A1 | 7/2019 | Cha et al. | |
| 2019/0348816 A1 | 11/2019 | Vethake et al. | |
| 2020/0099197 A1 | 3/2020 | Kudryashov | |
| 2020/0310120 A1 | 10/2020 | Grief | |
| 2020/0310122 A1 | 10/2020 | Chi | |
| 2020/0404228 A1 | 12/2020 | Grief/Facebook | |
| 2021/0278669 A1 | 9/2021 | Fabien | |
| 2022/0019021 A1 * | 1/2022 | Piper ........................ | H01S 5/50 |

FOREIGN PATENT DOCUMENTS

| | | | | |
|---|---|---|---|---|
| JP | 2007227801 A | 9/2007 | | |
| JP | 4155368 B | 7/2008 | | |
| WO | WO-2020197715 A1 * | 10/2020 | ............... | G02B 6/26 |

* cited by examiner

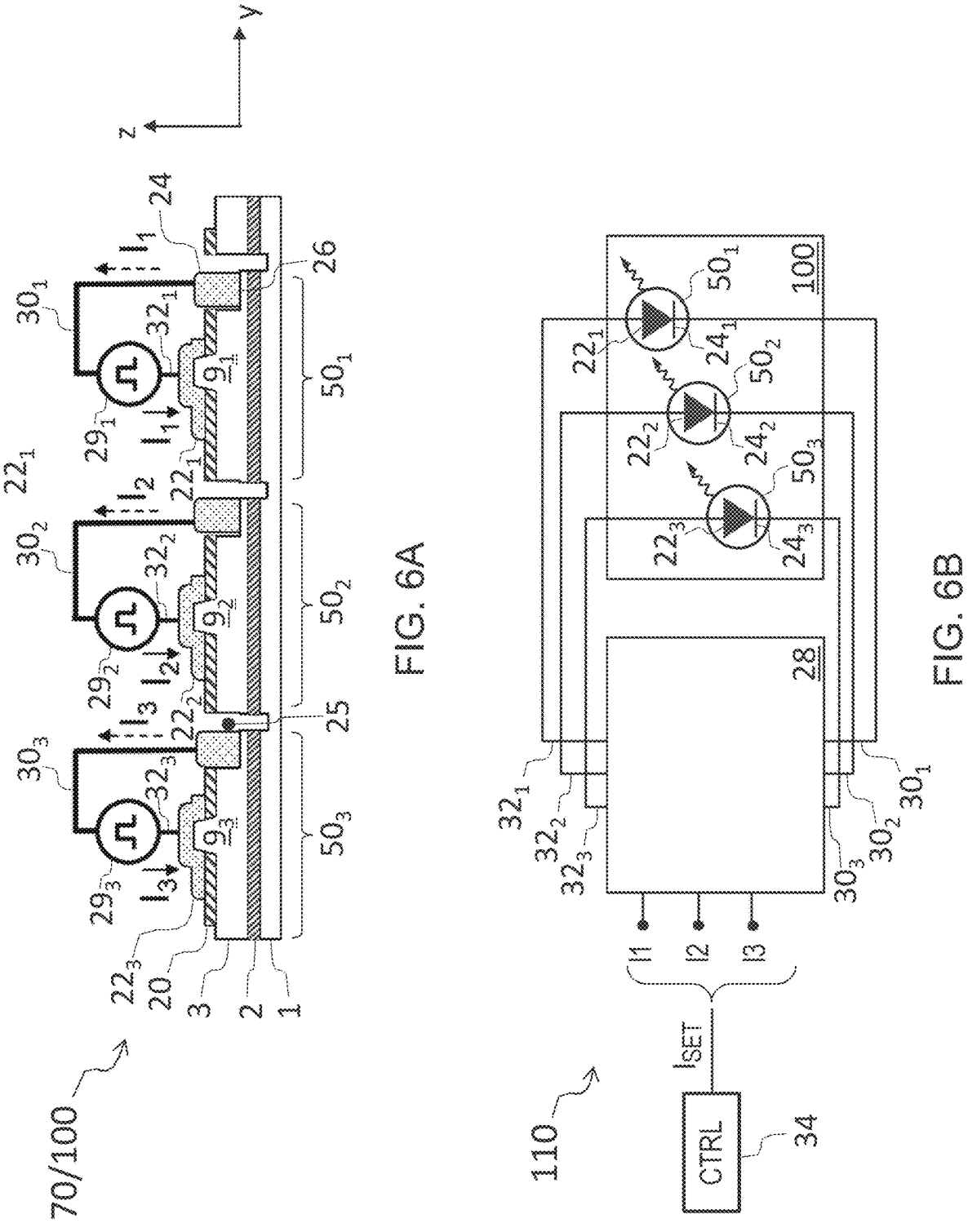

MONOLITHIC EDGE-EMITTING SEMICONDUCTOR DIODE ARRAYS

STATEMENT REGARDING FEDERALLY SPONSORED RESEARCH OR DEVELOPMENT

Not Applicable

CROSS-REFERENCE TO RELATED APPLICATIONS

This application claims priority to and the benefit of U. K. Patent Application No. GB2202159.6 filed 17 Feb. 2022, which is incorporated by reference in its entireties.

BACKGROUND OF THE INVENTION

Field of the Invention

The invention relates a monolithic edge-emitting semiconductor diode array for display applications.

Background

Semiconductor diode emitters for display applications include laser diodes (LDs) and superluminescent diodes (SLDs).

Monolithic LD and SLD array chips are known which are based on edge-emitting semiconductor LDs of the ridge-type and stripe-type. The term 'edge-emitting' is used, since the light is emitted with an optical axis in the plane of the active layer of the semiconductor heterostructure out of a side facet of the device structure. Monolithic edge-emitting semiconductor diode arrays naturally provide a one-dimensional (1D) array of emitters. Some examples of known monolithic edge-emitting semiconductor diode array chips for various different applications are as follows:

U.S. Pat. No. 4,977,570 (Canon)
U.S. Pat. No. 5,259,049 (IBM)
U.S. Pat. No. 5,887,012 (NEC)
US 2004/206975 A1 (Sony)
US 2010/329295 A1 (Sony)
US 2010/111129 A1 (Sony)
US 2017/123172 A1 (Oclaro)
US 2018/034243 A1 (Dilas Diodenlaser)
US 2019/348816 A1 (Trumpf Photonics)
US 2020/310122 A1 (Facebook)—see below for discussion In virtual reality (VR) and augmented reality (AR) display applications, the light emitting module is a component of a projector device for collimating and scanning the output beams to form an image. For color display applications, a light emitting module is needed that comprises red, green and blue (RGB) emitters. For monochrome display applications a light emitting module can be used with multiple emitters having the same emission wavelength. A VR/AR projector device is part of a head-mounted display (HMD), such as glasses, goggles or visors, or a head-up display (HUD). The output beams from the individual emitters, specifically LDs or SLDs, are scanned over the inside of a visor or goggles or the inside surface of a screen, e.g. a window, such as a vehicle windscreen/windshield in a car or aircraft. Another option for a HMD is to scan the output beams over the retina of a human eye which is referred to as direct retinal projection. Beam scanning of the output beams from the light emitting module is performed with a light engine based on micro-electro-mechanical system (MEMS) mirrors. The beam scanning generates frames of an image by raster scanning of the output beams across a display surface or otherwise across a user's field of view. An example design of a MEMS-based light engine for beam scanning is disclosed in US 2020/404228 A1 (Facebook).

For display applications, whether color or monochrome, it is a requirement that the individual emitters are individually drivable with independent control of both time (i.e. ON/OFF) and amplitude/intensity (i.e. optical output power or brightness). Moreover, for VR/AR display applications, a relatively fast modulation of each diode emitter is required to provide for sufficiently high frame refresh rates. Furthermore, for VR/AR applications, in particular for direct retinal projection, the image size is very small, so the pixel area is correspondingly small. It is therefore a requirement that the individual beams are formed very close together on the image. To eliminate or reduce the need for separate external optical components, such as lenses and mirrors, to manipulate the output beams from the light emitting module so they come closer together, it is desirable for the light emitting module to emit output beams from the individual emitters that are as close together (and also parallel to each other) as specified for the pixel separation.

US 2020/310120 A1 (Facebook) considers the resolution requirements for laser sources in VR/AR display applications and proposes the solution of using waveguides as beam concentrators to bring the outputs from different edge-emitting LD sources or superluminescent diode (SLD) sources closer together. The beam concentrator is arranged such that the output beam from each LD is guided exactly to the input of the associated passive waveguide of the beam concentrator. The passive waveguides are formed in a photonic integrated circuit (PIC).

US 2020/310122 A1 (Facebook) discloses a monolithic semiconductor SLD array chip for VR/AR display applications with six edge-emitting SLDs arranged in a 1D array. The six edge-emitting SLDs are formed as six parallel ridge waveguide structures which are bent towards the chip's output facet to avoid meeting it at right angles, thereby to suppress lasing. The SLDs have a common cathode (–), which grounds the substrate of the monolithic chip, and individual anodes (+) which are independently connected above the active region of each SLD. Each SLD is independently drivable by positively biasing the SLD to cause current to be pushed across the active region from a lower, n-doped section embedded in the substrate to an upper, p-doped section that is formed in the ridge.

BRIEF SUMMARY OF THE INVENTION

According to an aspect of the invention there is provided a monolithic edge-emitting semiconductor diode array chip comprising:

a conductive substrate;

a plurality of semiconductor layers arranged on the conductive substrate, the semiconductor layers including one or more active region layers sandwiched between upper and lower cladding layers; and one or more separation layers arranged between the conductive substrate and the lower cladding layer, front and back chip facets;

a plurality of ridges, each extending between the front and back chip facets and each having respective pairs of sides that define a waveguide in the active region layers, wherein the front chip facet defines an output coupling termination for the waveguides;

a trench extending between each pair of adjacent ridges, each trench having a base lying at a depth that is within or below the one or more separation layers; and a one-dimensional array of diodes, which are laser diodes, superluminescent diodes or semiconductor optical amplifiers, each diode having a gain region defined by one of the waveguides in combination with the active region layers and each being configured to emit an output beam from the front chip facet when driven under forward bias, wherein each diode of the one-dimensional array has its own upper and lower contacts that are arranged to contact the semiconductor layers above and below the active region layers so that each diode is independently drivable, wherein the upper and lower contacts form anode and cathode diode contacts to respective ones of the diodes or vice versa.

In other words, in some embodiments the anode contacts will be the upper contacts and the cathode contacts will be the lower contacts, whereas in other embodiments the cathode contacts will be the upper contacts and the anode contacts will be the lower contacts.

For each diode, its upper contact may be arranged to form an ohmic electrical connection with the upper cladding layer and its lower contact may be arranged to form an ohmic electrical connection with the lower cladding layer.

To be able to drive each diode independently it is necessary that the diodes remain electrically isolated from each other when the semiconductor diode array chip is being operated, i.e. when in forward bias.

In one embodiment, the one or more separation layers comprise lower and upper separation layers arranged between the conductive substrate and the lower cladding layer, the lower separation layer being undoped or oppositely doped to the substrate and the upper separation layer being doped in the same sign as the substrate and the lower cladding layer, and each trench having a base lying at a depth that is below the upper separation layer.

In one embodiment, the one or more separation layers comprise a separation layer arranged between the conductive substrate and the lower cladding layer, the separation layer being oppositely doped to the substrate, and each trench having a base lying at a depth that is either below the base of the oppositely doped separation layer or within the oppositely doped separation layer.

In one embodiment, the one or more separation layers comprise a separation layer arranged between the conductive substrate and the lower cladding layer, the separation layer being resistive, and each trench having a base lying at a depth that is either below the base of the resistive separation layer or within the resistive separation layer.

In some embodiments, the chip further comprises a photonic integrated circuit, PIC, formed monolithically on the substrate with the diode array and having front and back PIC facets, the PIC having a plurality of passive waveguides embedded therein, the back PIC facet facing the front chip facet of the diode array such that input ends of ones of the passive waveguides on the back PIC facet are aligned with the diode waveguide terminations on the front chip facet so as to receive and passively waveguide the output beams from the diode emitters to the front PIC facet for output from the chip.

In embodiments with a PIC, the front chip facet may be formed by etching, said etching also removing an area of the semiconductor layers, wherein the PIC is formed on the substrate by re-growth over the area removed by said etching.

In embodiments with a PIC, one or more of the passive waveguides may be curved so as to bring the output beams at the front PIC facet closer together than the output beams at the front chip facet.

In embodiments with a PIC, two or more of the passive waveguides may be arranged to act as couplers to superimpose multiple ones of the output beams at the front chip facet into a combined beam at the front PIC facet.

According to a further aspect of the invention there is provided a light emitting module comprising a monolithic edge-emitting semiconductor diode array chip as specified above; and a driver unit comprising a plurality of driver circuits, the driver circuits being connected across the anode and cathode contacts of respective diodes.

In some embodiments, each driver circuit comprises a current source connected to push a modulated push current through its associated diode. In other embodiments, each driver circuit comprises a current sink connected to extract a modulated pull current through its associated diode. In still further embodiments, each driver circuit comprises a current source connected to push a modulated push current through its associated diode and a current sink connected to extract a modulated pull current through its associated diode. Each driver circuit may further comprise a biasing current source connected to apply a DC bias current across its associated diode. In driver circuits with a current source the bias current is added to the push current. In driver circuits with a current sink the bias current is subtracted the pull current.

According to a still further aspect of the invention there is provided a display projector module comprising:

a light emitting module as defined above;

collimating optics configured to transform the output beams output from the chip into a plurality of collimated output beams; and a beam scanner for raster scanning the output beams to form an image.

According to a still further aspect of the invention there is provided a vision system configured to be placed on a human head incorporating a display projector module as define above into a head-mountable unit.

BRIEF DESCRIPTION OF THE DRAWINGS

This invention will now be further described, by way of example only, with reference to the accompanying drawings.

FIG. 6A is a schematic section of a monolithic edge-emitting semiconductor diode array based on ridge emitters according to an embodiment of the disclosure.

FIG. 6B is a schematic drawing of a light emitting module incorporating the diode array of FIG. 6A.

DETAILED DESCRIPTION OF THE INVENTION

Figures 1A, 1B, 1C:
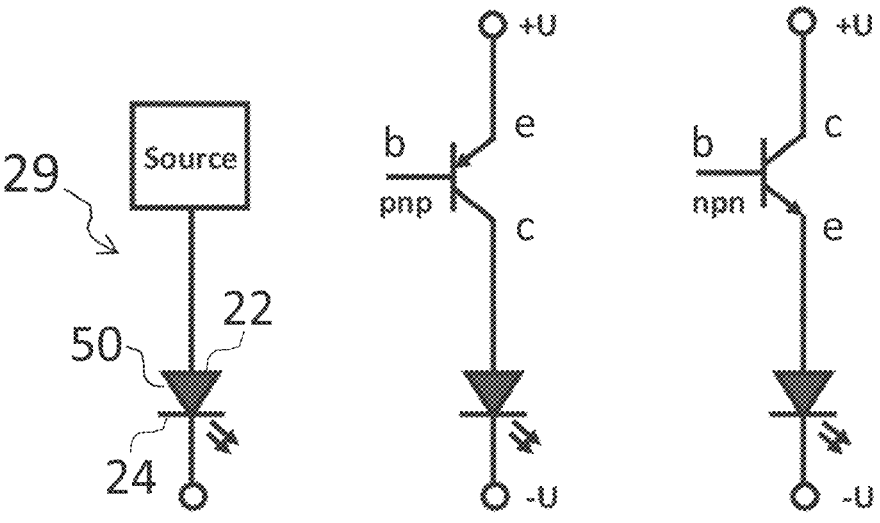
FIG. 1A is a schematic drawing of a driver circuit for a semiconductor diode emitter based on a current source configuration.
FIG. 1B shows an example of FIG. 1A with the current source being implemented with a pnp transistor.
FIG. 1C shows an example of FIG. 1A with the current source being implemented with an npn transistor.

In the following detailed description, for purposes of explanation and not limitation, specific details are set forth in order to provide a better understanding of the present disclosure. It will be apparent to one skilled in the art that the present disclosure may be practiced in other embodiments that depart from these specific details.

Semiconductor diode emitters including LDs, SLDs and semiconductor optical amplifiers (SOAs) are fabricated as an epitaxial stack of crystalline layers with at least one layer functioning as the active region, in which negative electrons and positive holes recombine and thereby emit photons, i.e. generate light. Electrons are injected from the outside through one contact pad; the n-contact. Holes are injected from the outside through another contact pad; the p-contact. When an electrical voltage is applied across these contact pads, both types of carriers are injected into the semiconductor structure and an electrical current flows through the structure: the negative electrons migrate first through at least one n-doped semiconductor layer before arriving at the pn-junction while the positive holes migrate first through at least one p-doped semiconductor layer before reaching the pn-junction. Typically, the pn-junction itself, i.e., the interface layer(s) between the n-doped and p-doped regions, is located at or near the active region of the device. The active region itself may include at least one quantum well (with a typical thickness in the range of 1 nm to 50 nm) that is surrounded or sandwiched in between so-called barrier layers, which are in turn surrounded by waveguide layers and cladding layers. Instead of a quantum well layer a thicker bulk layer may be used (with a typical thickness in the range of 50 nm to 500 nm). The active region might also include an arrangement of quantum dots.

Semiconductor devices that incorporate multiple diode emitters in an array, e.g. a 1D array, may require a corresponding array of p-contact pads and/or n-contact pads in order that the electrical injection current for each diode emitter can be adjusted individually. For certain applications, for example material processing or optical pumping of high-power solid-state lasers, the ability to independently drive the individual emitters is not necessary, e.g. when the goal is just to generate a vast amount of optical power along a certain stripe. Devices of this kind can have a single and common n-contact (electrode) and a single and common p-contact (electrode). However, certain applications, for example in the field of printing or display applications, require that the individual diode emitters of an array are individually addressable and controlled through respective individual driver circuits, typically based on current sources.

A semiconductor diode array device based on multiple individually addressable diode emitters requires one of the following configurations:

a) An array of individual p-contact pads and a common n-contact pad;

b) An array of individual n-contact pads and a common p-contact pad; or c) An array of individual p-contact pads and an array of individual n-contact pads.

It is common in the semiconductor industry to use n-doped wafer substrates (e.g., GaAs, GaN, InP) and to grow the epitaxial structure for the diode emitters on such substrates. Here, the first layer(s) grown would be n-doped layer(s), for example an n-doped matching layer followed by n-doped cladding layers followed by n-doped or undoped waveguide layers. Afterwards, the layers belonging to the active region would be grown, which are typically undoped. After that, p-doped or undoped waveguide layers are grown followed by p-doped cladding layers and then a p-doped matching layer. The final top layer of the structure would be typically a highly doped "p-cap" layer onto which the metallic contacts are deposited during wafer processing.

Semiconductor diode array devices that are realized on n-doped substrates would, therefore, also typically have a common n-contact pad (at the bottom side of the chip), so they would be typically of type b) from the list shown above, unless they are realized with some MESA-type structure in which the n-contact is also accessible through a contact pad on the top side.

For operating an array of diode emitters through individually addressable driver electronics, it will be most advantageous to have a device structure of type c) as the individual diode emitters in the array will behave in exactly the same way as an individual diode emitter device. That means that any kind of electrical current source or current sink architecture can be realized, which provides greatest flexibility with the electronic design and with available electronic components. It will be understood that in the following where we refer to a current sink, this is in fact a current source from the point of view of a stand-alone circuit component but is referred to as a current sink in view of where it is arranged in the overall driver circuit to "pull" current through the diode emitter.

FIG. 1A is a schematic drawing of a driver circuit 29 for a semiconductor diode emitter 50 based on a current source configuration. The semiconductor diode emitter 50 has a p-type anode 22 and an n-type cathode 24. The semiconductor diode emitter 50 is thereby addressed and driven by an electrical driver circuit 29 that acts as a current source generating an electrical current that flows to and through the diode emitter (hence the term "push" for such driver circuit configurations) and thereby generates a light output.

FIG. 1B shows the same generic arrangement as FIG. 1A with the example of the current source being implemented with a pnp transistor. The transistor's base, b, is connected to receive the drive signal voltage. The transistor's emitter, e, (not to be confused with the diode emitter) is connected to a positive bias voltage (+U). The transistor's collector, c, is connected to the p-contact of the diode emitter, i.e. its anode 22. The n-contact of the diode emitter, i.e. its cathode 24, is connected to a negative bias voltage (−U). The negative bias voltage may be realized as an electrical ground (GND).

FIG. 1C shows the same generic arrangement as FIG. 1A with the example of the current source being implemented with an npn transistor. The transistor's base, b, is connected to receive the drive signal voltage. The transistor's collector, c, is connected to the positive bias voltage (+U). The transistor's emitter, e, is connected to the p-contact of the diode emitter, i.e. its anode 22. The n-contact of the diode emitter, i.e. its cathode 24, is connected to a negative bias voltage (−U). The negative bias voltage may be realized as an electrical ground (GND).

Figures 2A, 2B, 2C:
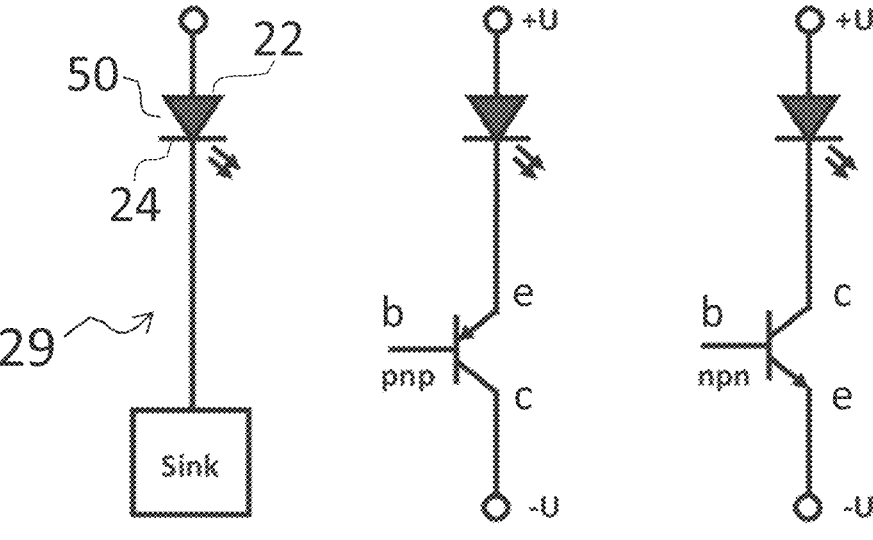
FIG. 2A is a schematic drawing of a driver circuit for a semiconductor diode emitter based on a current sink configuration.
FIG. 2B shows an example of FIG. 2A with the current sink being implemented with a pnp transistor.
FIG. 2C shows an example of FIG. 2A with the current sink being implemented with an npn transistor.

FIG. 2A is a schematic drawing of a driver circuit 29 for a semiconductor diode emitter 50 based on a current sink configuration. The semiconductor diode emitter 50 has a p-type anode 22 and an n-type cathode 24. The semiconductor diode emitter 50 is thereby addressed and driven by an electrical driver circuit 29 that acts as a current sink, sinking an electrical current that flows from and through the diode emitter (hence the term "pull" to describe such driver circuit configurations) and thereby generates a light output.

FIG. 2B shows the same generic arrangement as FIG. 2A with the example of the current sink being implemented with a pnp transistor. The transistor's base, b, is connected to receive the drive signal voltage. The p-contact of the diode emitter, i.e. its cathode 24, is connected to a positive bias voltage (+U). The n-contact of the diode emitter, i.e. its anode 22, is connected to the transistor's emitter, e. The transistor's collector, c, is connected to a negative bias voltage (−U). The negative bias voltage may be realized as an electrical ground (GND).

FIG. 2C shows the same generic arrangement as FIG. 2A with the example of the current sink being implemented with an npn transistor. The transistor's base, b, is connected to receive the drive signal voltage. The p-contact of the diode emitter, i.e. its anode 22, is connected to a positive bias voltage (+U). The n-contact of the diode emitter, i.e. its cathode 24, is connected to the transistor's collector, c. The transistor's emitter, e, is connected to a negative bias voltage (−U). The negative bias voltage may be realized as an electrical ground (GND).

Figures 3A, 3B:
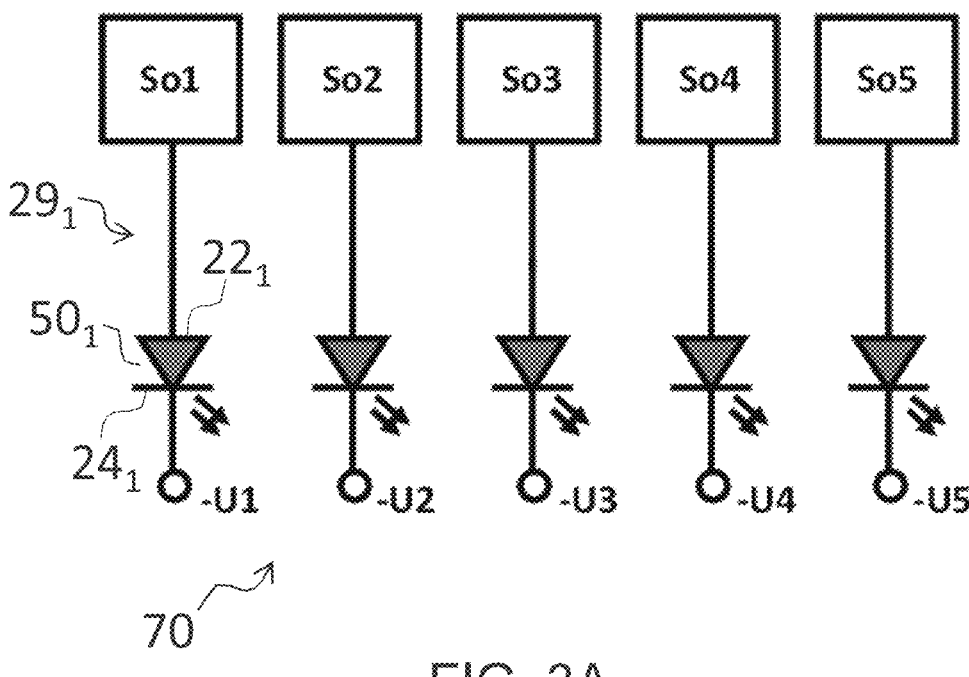
FIG. 3A is a schematic drawing of a driver circuit for a semiconductor diode array based on a current source configuration, in which each diode emitter is connected to its own current source driver circuit (So1 to So5) and its own negative bias voltage (−U1 to −U5).
FIG. 3B is a schematic drawing of a driver circuit for a semiconductor diode array based on a current source configuration, in which each diode emitter is connected to its own current source driver circuit (So1 to So5) and a common negative bias voltage (−Ub).

FIG. 3A shows a semiconductor diode array 70 comprising an array of five diode emitters 50_1 to 50_5. The p-contact of each diode emitter 50_k, i.e. its anode 22, is electrically connected to its own dedicated current source driver circuit 29_k (also labelled So1 to So5). The n-contact of each diode emitter 50_k, i.e., its cathode 24, is electrically connected to its own negative bias voltage (−U1 to −U5). The negative bias voltage for each diode emitter could be an individual electrical GND potential. This arrangement allows individual current control through each diode emitter, therefore allowing the optical output power of each diode emitter to be controlled independently of the other diode emitters. This arrangement would apply to semiconductor emitter arrays of type c) above.

FIG. 3B shows a related semiconductor diode array 70 comprising an array of five diode emitters 50_1 to 50_5. Like the arrangement of FIG. 3A, the p-contact of each diode emitter 50_k, i.e. its anode 22, is electrically connected to its own dedicated current source driver circuit 29_k (labelled So1 to So5). However, unlike the arrangement of FIG. 3A, the diode emitters 50_k have their cathodes 24 connected to a common negative bias voltage (−Ub). This might be the case for diode emitter arrays that have a common n-contact pad while still having individual p-contact pads. This arrangement would apply to arrayed semiconductor emitter arrays of type a) above.

Semiconductor diode array devices of type b) having a common p-contact pad but individual n-contact pads do not allow individual (i.e. independent) current adjustment for each diode emitter with an electrical current source architecture.

A limitation of the arrangement of FIG. 3B is that the current flow through any one of the diode emitters can be influenced by the current flow through the other diode emitters. In a steady-state or slow-moving condition, this effect may be minimal or non-existent, but at times of rapid current adjustment the effect is significant. For example, there may be a large effect during turn-on or turn-off of one diode emitter or during fast amplitude changes of the injection current. In such cases, the respective current flows through the different diode emitters are not independent of each other. The reason for this is that most electrical circuits that are used to generate an injection current have an internal control loop to measure and adjust the injection current. These control loops have a certain finite response time, so that current or voltage transients that are faster than the control loop's response time cannot be followed. For example, a typical control circuitry would deploy a shunt resistor of small value (e.g., 0.5 Ohm) in series to the electrical load, in this case the diode emitter, and would measure the voltage across this shunt as a reference for the generated injection current. The voltage measurement might be done using an operational amplifier with the input being electrically connected to the shunt resistor. The output of the operational amplifier would then be compared against a set voltage, for example using a second operational amplifier, and the output of this second operational amplifier would be connected to the base of a transistor that is controlling the injection current through the diode emitter. Although other types of current control loop exist, it is generally true that any control loop will have a certain finite time constant, e.g. as defined by the bandwidth of operational amplifiers or by the specific arrangement of capacitors and resistors in this control loop, which could be part of an integrating circuit.

The magnitude of the time constant that is required of the current-generating electronic circuit, i.e. the internal circuit design of the current source that is to be used in either a current source driver configuration (FIGS. 1A to 1C) or a current sink driver configuration (FIGS. 2A to 2C) will vary depending on the application. A time constant in the range of milliseconds may be needed for applications that require an ultra-stable and low-noise injection current. A time constant in the range of microseconds may be needed for applications that require fast modulation (e.g., several tens of kHz) of the injection current's amplitude. A time constant in the range of nanoseconds may be needed for applications that require an ultra-fast adjustment (e.g., several tens of MHz) of the injection current's amplitude.

Regardless how small the time constant of the current-generating electronic circuit is made, there could be transients on the negative bias voltage that are faster than the time constant that the circuit cannot regulate, thereby generating unwanted current spikes that may translate into unwanted spikes of the optical output power. As an example, such ultra-fast voltage transients could occur during power-up or power-down events of certain parts of the electronics, for instance a neighboring current-generating circuitry. Another example is during power-up/down events of supply voltages or of the whole system, for instance during unforeseen power outages and collapse of the supply voltages.

It is, therefore, the case that an arrangement with individual p-contact pads and individual n-contact pads for each diode emitter of the array (as shown in FIG. 3A) is preferable over an arrangement in which all diode emitters share a common n-contact pad (as shown in FIG. 3B).

The same thoughts and considerations apply to a current sink architecture.

Figure 4A:
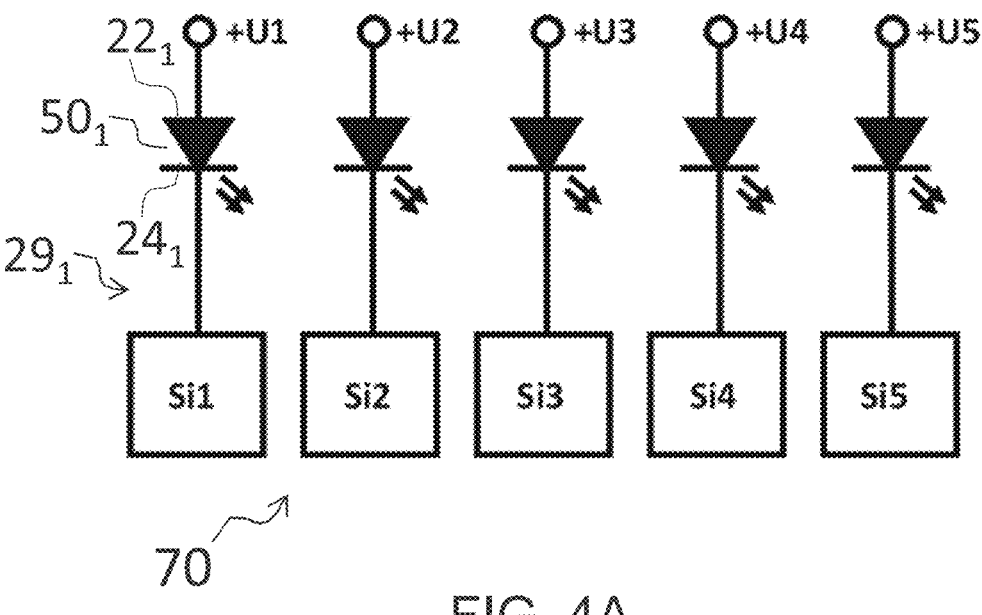
FIG. 4A is a schematic drawing of a driver circuit for a semiconductor diode array based on a current sink configuration, in which each diode emitter is connected to its own current sink driver circuit (Si1 to Si5) and its own positive bias voltage (+U1 to +U5).

FIG. 4A shows a semiconductor diode array 70 comprising five diode emitters 50_1 to 50_5. The p-contact of each diode emitter 50_k, i.e. its anode 22, is electrically connected to its own positive bias voltage (+U1 to +U5). The n-contact of each diode emitter 50_k, i.e. its cathode 24, is electrically connected to its own dedicated current sink driver circuit 29_k (labelled Si1 to Si5). This arrangement allows individual current control through each diode emitter, therefore allowing adjustment of the optical output power of each diode emitter independently of the other diode emitters. This arrangement would apply to semiconductor emitter arrays of type c).

Figure 4B:
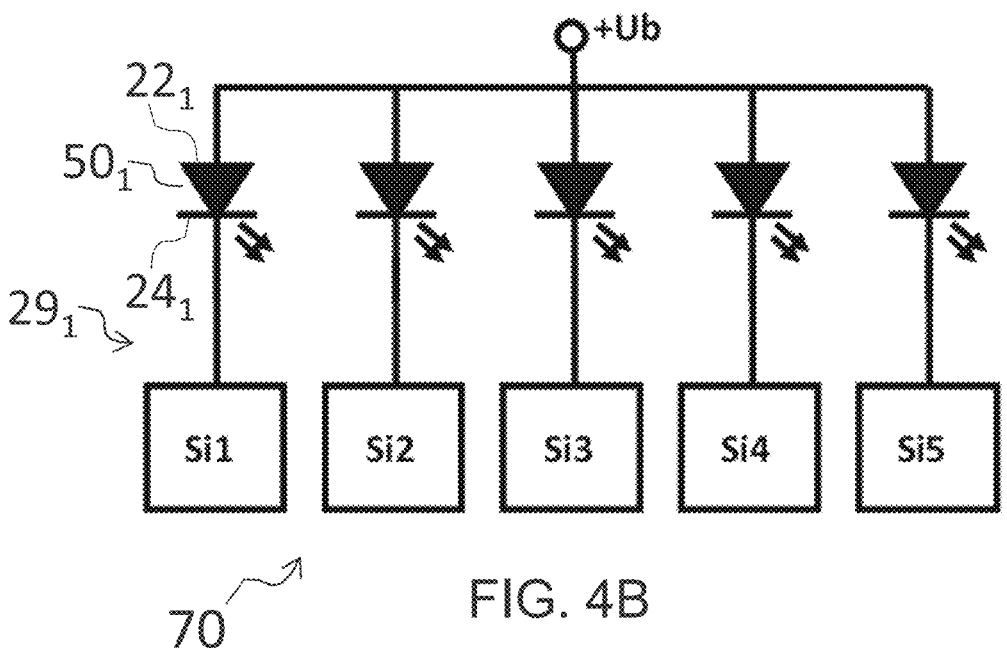
FIG. 4B is a schematic drawing of a driver circuit for a semiconductor diode array based on a current sink configuration, in which each diode emitter is connected to its own current sink driver circuit (Si1 to Si5) and a common positive bias voltage (−Ub).

FIG. 4B shows a semiconductor diode array 70 comprising five diode emitters 50_1 to 50_5. Like the arrangement of FIG. 4A, the n-contact of each diode emitter 50_k is electrically connected to its own dedicated current sink driver circuit 29_k. However, unlike the arrangement of FIG. 4A, the diode emitters 50_k have their anodes 22 connected to a common positive bias voltage (+Ub). This might be the situation for a diode emitter array that has a common p-contact pad and individual n-contact pads. This arrangement would apply to arrayed semiconductor devices of type b). Arrayed semiconductor devices of type a) having a common n-contact pad but individual p-contact pads will not allow individual current adjustment for each diode emitter with an electrical current sink architecture.

Similar to the considerations discussed above for current source architectures, an arrangement of a semiconductor diode array with individual p-contacts and individual n-contact pads for each diode emitter (as shown in FIG. 4A) is preferable over an arrangement where all the diode emitters share a common p-contact pad (as shown in FIG. 4B).

In addition, certain display applications such as laser beam scanning (LBS) architectures with fast pixel-to-pixel adjustments of the injection currents on time scales of nanoseconds might be easier to realize with electronic circuitries and designs that rely on current sink topologies. This preference might be related to specific details of how fast current drivers can be realized in SiGe or CMOS electronics. For instance, various commercially available and existing driver integrated circuits (ICs) from the company Intersil-Renesas are designed for display applications, including LBS architectures, and are based on current sink topologies, for example the 3-channel LD driver ILS58315 or the 4-channel LD driver ILS78365. These driver ICs and the integrated driver circuitries would not be compatible with arrayed semiconductor light sources of type a) that have a common n-cathode.

Therefore, such display systems would benefit from semiconductor diode arrays of type c) with separate and individual n-contacts and p-contacts, since they will offer the greatest flexibility for the integration of the light source chip and the integrated circuit used to realize the driver circuit. This is true whether the driver circuit is implemented with a current sink topology or a current source topology.

Figures 5A, 5B:
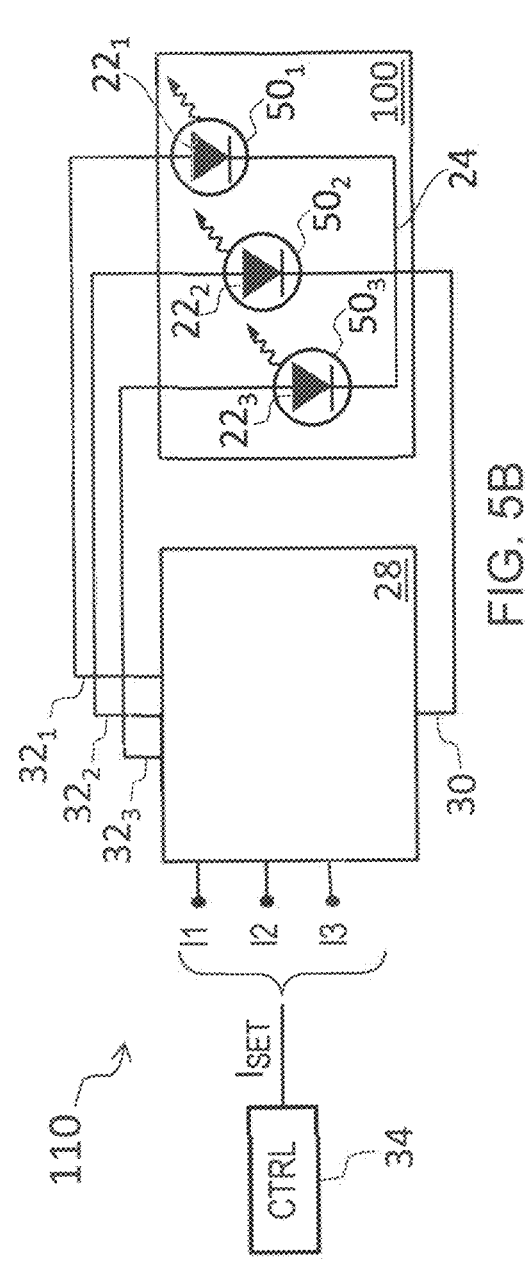
FIG. 5A is a schematic section of a monolithic edge-emitting semiconductor diode array based on ridge emitters driven in a current source ('push') configuration as known in the prior art.
FIG. 5B is a schematic drawing of a light emitting module incorporating the diode array of FIG. 5A.

FIG. 5A is a schematic section of an edge-emitting semiconductor diode array 70 formed monolithically as a chip 100 that is based on a 1D array of 'k' diode emitters 50_k, each driven independently in a current source ('push') configuration according to the prior art. The diode emitters 50_k have a common cathode 24, which grounds the substrate 1 of the monolithic chip 100, and individual anodes 22_k which are independently connected to each ridge 9_k and insulated from each other by an intermediate isolation layer 20. To manufacture the monolithic diode array chip 100, a wafer is grown from a substrate 1 by depositing a suitable diode emitter layer sequence 3 to create the semiconductor diode structure, each diode emitter 50_k being associated with a ridge 9_k. By way of example, three diode emitters 50_k are shown. To operate the diode emitters 50_k simultaneously and independently from one another, as is needed for display applications, pulsed driver circuits 29_k are connected to the anodes 22_k and grounded to the common cathode 24 and are configured to operate in current source mode with the current I_k being pushed through the anodes 22_k. The 'push' current flow path is illustrated by the solid arrows.

FIG. 5B is a schematic drawing of a light emitting module 110 including a driver unit 28 and other components suitable for integration of a three-emitter array chip 100 according to FIG. 5A. The three diode emitters 50_1, 50_2 and 50_3 are controlled by respective driver circuits 29_3, each of which is connected across the associated pair of anode and cathode electrodes 22_k, 24_k by respective anode lines 32_1, 32_2 and 32_3 and commonly connected cathode lines 30 which are grounded. The driver circuits 29_k act as current sources that receive respective voltage signals VSET from a controller 34 as input and output correspondingly modulated currents ISET to drive the respective diode emitters 50_k. The drive currents are labelled 1_1, 1_2 and 1_3. The current modulation serves to switch the associated diode emitter 'on' and 'off' and, when 'on', to vary the diode emitters output power or brightness.

This is the same electrical set-up as in the above-described US 2020/310122 A1, although the physical arrangement of US 2020/310122 A1 is different from FIG. 5A in that the monolithic chip is attached to a passive mechanical substrate on the side of the common cathode contact 24. The attachment process is performed for ease of packaging and the common cathode extends to the surface of the mechanical substrate after the attachment.

A current source configuration using a common cathode has certain disadvantages. The electrical linkage between the different emitters can cause electrical interference, multi-emitter cross-talk and emitter-to-emitter electrical shorting, none of which is desirable for AR/VR display applications.

Modulation speed is also limited which is also not desirable for AR/VR display applications.

FIG. 6A is a schematic section of a monolithic edge-emitting semiconductor diode array 70 formed monolithically as a chip 100 according to an embodiment of the invention. The diode array chip 100 is based on a 1D array of diode emitters 50_*k*, each with their own pair of independently drivable anode and cathode contacts 22_*k*, 24_*k* to allow each diode emitter to be driven either via a current source or a current sink ('push' or 'pull'). The dashed arrows are to schematically show current sink operation and the solid arrows are to schematically show current source operation. By way of example, three diode emitters 50_*k* are shown. To manufacture the monolithic diode array 70, a wafer is grown from a substrate 1 by depositing a separation layer sequence 2 (or in other embodiments described further below a single separation layer) and then a diode emitter layer sequence 3 to create the semiconductor diodes and waveguide. The semiconductor diodes may be LDs or SLDs. The wafer is lithographically processed by suitable etching to form ridges 9_*k* for the waveguiding. After the etching to form the ridges, an isolation layer 20, e.g. of SiN, Si, photoresist, or other dielectric material, is deposited on the top surface of the wafer leaving the tops of the ridges 9_*k* exposed out of the isolation layer 20. Trenches 25 are then etched between each pair of adjacent ridges 9_*k* down to the separation layer sequence 2, or optionally beyond into the substrate 1, so there will be n−1 such trenches. Optionally a further similar trench may be formed at either or both ends of the array (not illustrated). The trenches 25 form grooves in the chip 100 that extend parallel to adjacent ones of the ridges 9_*k*. The trenches 25 may be infilled or left exposed. A further etch (or in some embodiments the same etch) adjacent each trench 25 creates a step 26_*k* in each diode emitter layer sequence 3, where the steps 26_*k* are at the level of the lower cladding layer (n.b. a suitable diode emitter layer sequence 3 is discussed in more detail below). Individual anode contacts 22_*k* for the diode emitters 50_*k* are formed by metallization on top of each ridge 9_*k*. Individual cathode contacts 24_*k* for each of the diode emitters 50_*k* are formed by metallization on top of the exposed steps 26_*k* in the lower cladding layer. The diode emitters 50_*k* are controlled by respective driver circuits 29_*k*, each of which is connected across the associated pair of anode and cathode electrodes 22_*k*, 24_*k* by respective anode lines 32_1, 32_2 and 32_3 and respective cathode lines 30_1, 30_2 and 32_0. The anode and cathode electrodes are metal or metallic and form an ohmic connection with the semiconductor material to which they are interfaced. In other words, there is a first conductive path between each cathode 24_*k* and its driver circuit 29_*k* and a second conductive path between each anode 22_*k* and its driver circuit 29_*k*.

The edge emitters and the optical axes of their output beams are separated by a characteristic lateral separation, referred to as the pitch. Most conveniently, the pitch will be constant to form a regular 1D array, but an irregular separation of the diode emitters is in principle possible. In specific implementation examples, the lateral separation between the diode emitters may be less than 100 μm, perhaps as low as 5 μm, typically a separation value in the range 10-25 μm range would be suitable for many AR/VR display applications.

FIG. 6B is a schematic drawing of a light emitting module 110 including a driver unit 28 and other components suitable for integration of a three-diode emitter array chip 100 according to FIG. 6A. There may be three diode emitters 50_1, 50_2 and 50_3 as shown and they will all have the same output color (e.g., blue, green or red).

Figure 7A:
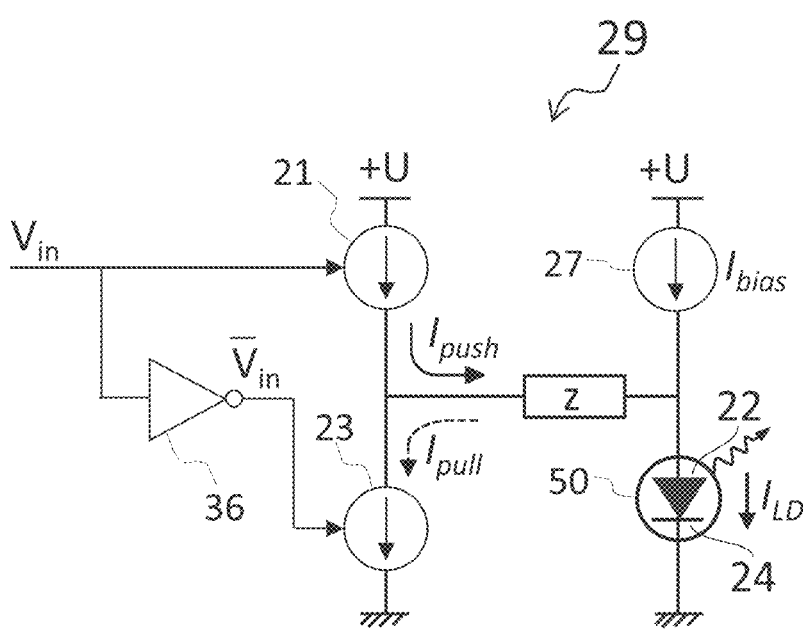
FIG. 7A is a schematic circuit diagram of an example driver circuit for one of the diode emitters.

FIG. 7A is a schematic circuit diagram of one the driver circuits 29 together with ancillary components. A source-sink driver circuit 29 is connected between each pair of anode and cathode contacts 22, 24, so that the different emitters can be independently driven both in time (ON/OFF) and amplitude (brightness). The current flow for current source operation, $I_{push}$, is shown with a solid arrow and the current flow for current sink operation, $I_{pull}$, is shown with a dashed arrow. The current flowing through the diode emitter 50, $I_{LD}$, is also shown. The driver circuit 29 comprises a current source 21 and a current sink 23. (What we refer to as the current sink 23 is electrically speaking a current source in the same way as the current source 21 but is referred to as a current sink in view of where it is arranged in the overall driver circuit 29.) The current source 21 is supplied with the drive voltage input signal V_in and the current sink 23 is provided with an inverted version thereof generated by passing a component of the voltage input signal V_in through an inverter 36. The current source 21 and current sink 23 may be based on a complementary pair of npn and pnp bipolar (junction) transistors or equivalent FET transistors (e.g. MOSFETs) or a mixture of bipolar and FET transistors. These may be in a so-called totem pole configuration. A further current source 27 is optionally also provided to generate a DC bias current across the diode emitter 50 and regulate the average optical power output from the diode emitter 50. From the current source 21, the diode emitter 50 receives the modulated push current, which is summed with the DC bias current supplied to the diode emitter 50 by the DC current source 27. The current sink 23 extracts the modulated pull current from the diode emitter 50, the pull current being subtracted from the DC bias current. The source-sink configuration can be operated at higher frequencies than a source-only (shunt or open-drain) configuration, as is desirable for display applications. A source-sink driver circuit 29 also has a reduced power consumption compared to a source-only driver circuit, since a smaller drive voltage will generate the same optical output power. It is noted that the DC biasing current source, if included, could be shared among multiple ones of the diode emitters, e.g., there may be only one such source for the whole chip, i.e. one for all the diode emitters.

Figure 7B:
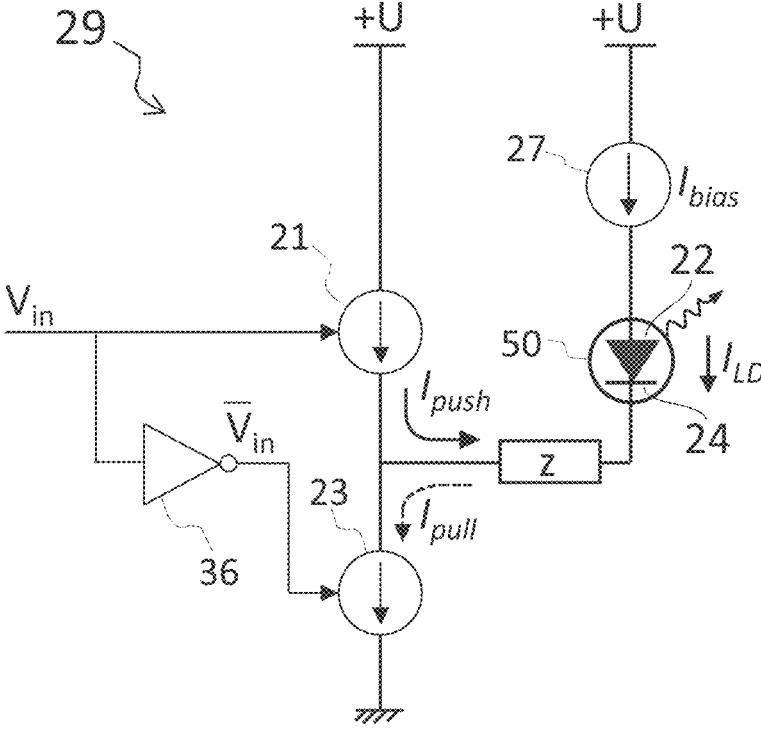
FIG. 7B is a schematic circuit diagram of another example driver circuit for one of the diode emitters.

FIG. 7B is a schematic circuit diagram of another example driver circuit for one of the diode emitters. Compared with the circuit of FIG. 7A in which the drive voltage is sourcing current, in the circuit of FIG. 7B the drive voltage is sinking current, i.e. the drive voltage signals (inverted and non-inverted) are applied to the cathode side of the diode emitter rather than the anode side. The diode emitter 50 is connected to ground via the current sink 23.

Figure 8:
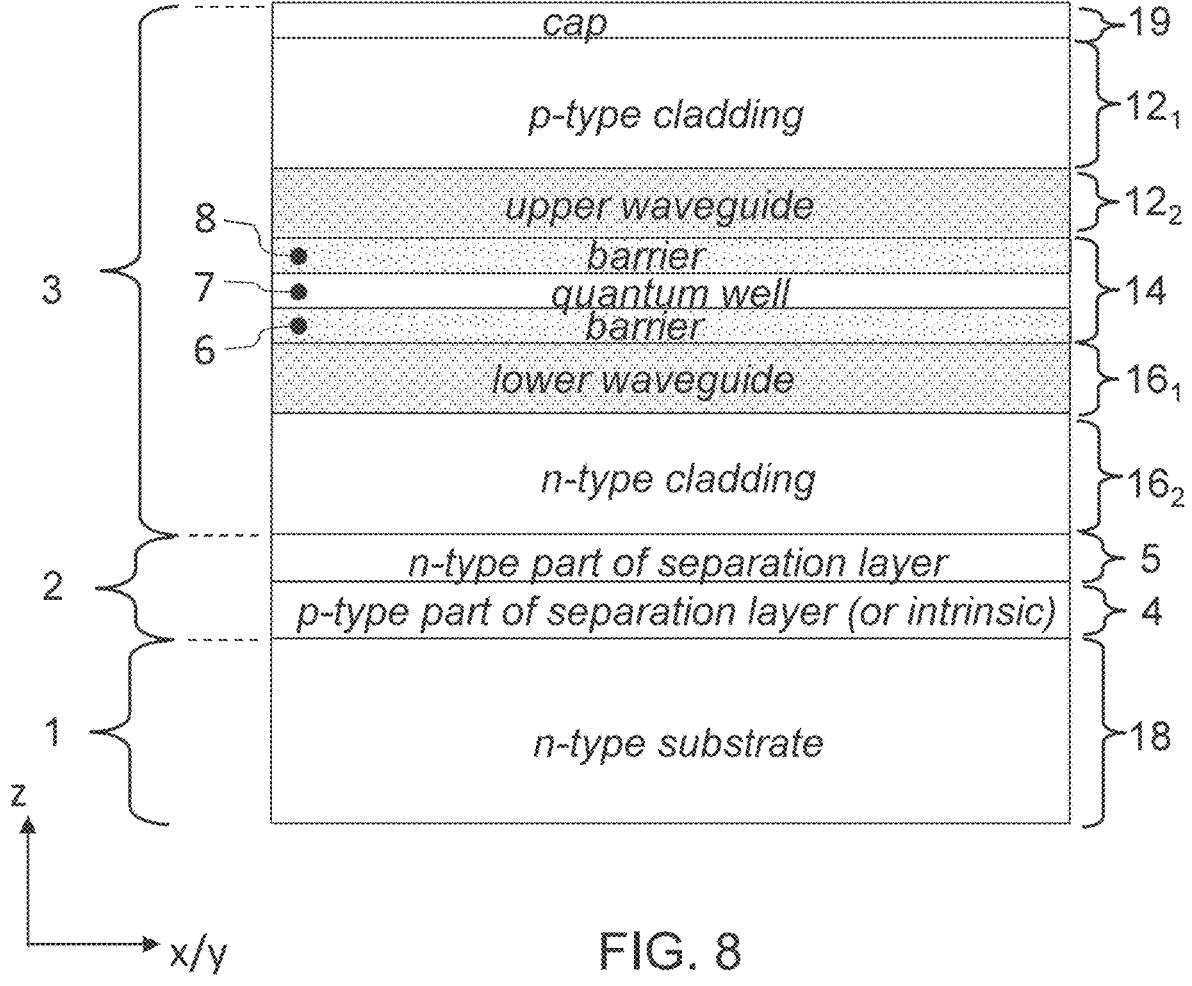
FIG. 8 shows a semiconductor heterostructure suitable for fabricating a monolithic LD or SLD array chip according to embodiments of the disclosure.

FIG. 8 is a schematic cross-section showing an example epitaxial layer sequence for a wafer. This shows the situation prior to post-growth processing to form ridges, to etch trenches, to deposit electrodes etc. The wafer is based on an n-type substrate 1 on which is deposited a separation layer sequence 2 and then a diode emitter layer sequence 3. The separation layers 2 are, from the substrate 1 up, a p-type separation layer 4 (or optionally intrinsic or semi-insulating) followed by an n-type separation layer 5. The diode emitter layers 3 are, from the substrate 1 up: lower outer cladding layer 162, lower inner cladding layer 161, active region layers 6, 7, 8 (collectively labelled as 14), upper inner cladding layer 122, upper outer cladding layer 121, and cap layer 19. The active region layers 6, 7, 8 are of higher refractive index than the waveguide layers 161, 122, which are in turn of higher refractive index than the cladding layers 162, 121.

Waveguiding in the active region layers 14 is ensured by the active and waveguiding layers being bounded in the stack direction (z-direction) by areas of lower refractive index (cladding layers 121 and 162). The vertically adjacent parts of the p-type and n-type layers are given a lower refractive index than the active region layers by a suitable material choice in a heterostructure. It will be understood that reference to top and bottom are for convenience. For example, flip-chip bonding techniques may be applied which would reverse the layer sequence in a packaged device compared to the layer sequence as grown.

In terms of carriers, the cladding layers 162, 121 are respectively doped p-type and n-type to enable carrier injection across the active region layer(s) 14. The active region layers 6, 7, 8 form a quantum well (QW) structure, with a QW layer 7 sandwiched between lower and upper barrier layers 6 and 8. If the active region has a multiple quantum well (MQW) structure, then the layer sequence for each QW is repeated multiple times. Quantum dots or other reduced dimensional structures may also be incorporated in the active layer. In operation, each QW hosts a reservoir of carriers that are available for stimulated emission, each QW having a suitable band gap (or band gaps) for providing the amplification as needed by a LD or SLD. The etch to form the trenches 25 goes through the n-type separation layer 5 and terminates at the p-type separation layer 4. The etch to form the steps 26 terminates in the lower cladding layer 162 or the n-type separation layer 5 or at the interface therebetween.

The edge-emitting semiconductor diode array chip may be according to any one of several known technologies. It may be based on a ridge-waveguide for either SLDs or LDs. For LDs, a Fabry-Perot cavity may be part of the chip design. The edge-emitting LDs could follow a distributed feedback (DFB) design. Moreover, a buried heterostructure design may be used.

It will be appreciated that each of the illustrated layers may be made of multiple layers. Additional layers (not shown) may also be included, e.g. buffer layers immediately on top of the substrate. Moreover, other structures are possible, e.g. with graded refractive index designs. Moreover, the inverse structure may be created in which the n-type and p-type doping as specified above for each of the layers is swapped to p-type and n-type respectively in which case the anode and cathode would also swap, i.e. the cathode contacts would be on top of the ridges and the anode contacts on the steps.

Regarding the thickness of the active region 14, this is principally defined by the thickness of the waveguide core between the waveguide layers, the core being formed by the QW region and the cladding being formed by the inner cladding layers. The active region thickness can be taken as either the sum of the thicknesses of the layers 6, 7, 8 between the lower and upper waveguide layers 161 and 122, or the distance between the bottom of the upper waveguide layer 122 and the top of the lower waveguide layer 161. In a typical implementation with a single QW (SQW) or MQW structure, the active region thickness will be the sum of the thicknesses of the quantum well and barrier layers, possibly including any additional layers that may be present between the SQW or MQW structure and the waveguide cladding layers. Another alternative is to have an active region without quantum wells, i.e. based on a conventional pn-junction across a bulk, i.e. 3D, band gap. Each ridge is formed after growth of the epitaxial structure by etching away the cap layer 19 and a part of the cladding layer 121. A dielectric layer 20 is then deposited to cover the surface of the outer cladding layer 13. A top contact layer for the anode is deposited on the top of each ridge over the remaining areas of the cap layer 19. The cathode contacts are fabricated as described above. The anode and cathode contacts serve as electrodes to allow their respective driver circuits to supply a drive current across the waveguide's gain region.

LD or SLD chips according to such designs can be used for green and blue emitters in particular, but also can be used for red emitters.

Commercially, the dominant materials system for current blue or green LDs and SLDs is based around gallium nitride and related materials, principally those in which gallium is partially or wholly substituted with aluminum and/or indium in the quaternary system GaAlInN The structure of a blue or a green LD or SLD chip may be made from the GaAlInN materials system in which one or a multiple number of light emitting, active layers are sandwiched between doped layers of different type. The active layers may contain Ga, Al and In elements in any desired alloy to provide the desired band gaps, refractive indices and other relevant properties in the heterostructure. The p-type layers are arranged above the active layers in the stack, i.e. towards the surface of the device structure. The n-type layers are arranged below the active layers, i.e. in between the light emitting, active layers and the substrate. The substrate may be a c-plane free-standing GaN substrate, or a GaN substrate of a non-polar or semi-polar orientation. Both n-type and p-type layers may contain different molar percentages of the substitutional elements Al, In and Ga to provide the desired band gaps, refractive indices and other relevant properties in the semiconductor heterostructure.

In blue and green LD and SLD chips, the heterostructure includes one or a multiple number of light emitting layers (active layers) that are sandwiched between doped layers of different type. The active layers may contain Al, In, Ga, N elements. P-type layers are above, towards the surface of the device. N-type layers are below, in between the light emitting layers and a substrate (preferably c-plane free-standing GaN). Both n- and p-layers may contain Al, In, Ga, N elements. The blue and green LDs or SLDs of certain examples include:

n- and p-doped conducting (Al, In, Ga)N layers;

(Al, In, Ga)N light emitting layers (light emitting layers/ quantum wells—QWs); and/or Light confining layers: (Al, In, Ga)N cladding layers and waveguides (which may be included in the p-layers, in the n-layers or at the upper and lower boundaries of the emitting region).

In red LD and SLD chips, the semiconductor heterostructure may be made of one or a multiple number of light-emitting layers that are sandwiched between doped layers of different type. The active layers may contain In, Al, Ga, As or In, Al, Ga, P elements. P-type layers are above, towards the surface of the device. N-type layers are below, in between the light emitting layers and a substrate (GaAs). Both n- and p-layers may contain In, Al, Ga, As or In, Al, Ga, P elements. Similar to blue and green LDs, the body of the red LDs may include n- and p-conducting layers, light emitting layers (quantum wells) and/or light confining layers (claddings and waveguides).

The structure of a red LD or SLD chip may be made from the GaAlInAsP materials system. The body of the red LD or SLD can be made of one or a multiple number of light-emitting layers that are sandwiched between doped layers of different type. The active layers may contain In, Ga and P elements in any desired alloy to provide the desired band gaps, refractive indices and other relevant properties in the semiconductor heterostructure. The p-type layers are arranged above the active layers, i.e. towards the surface of the device structure. The n-type layers are arranged below the active layers, i.e. in between the light emitting, active layers and the substrate, for example a GaAs substrate. The substrate could have any suitable crystallographic orientation, but in particular either a <1 0 0> direction or a 10-degree offcut from <1 0 0> towards <1 1 1>. Both the n-type and p-type layers may contain Al, In, Ga, P elements in any desired alloy to provide the desired band gaps, refractive indices and other relevant properties in the heterostructure.

In specific examples, the monolithic semiconductor diode array 70 is based on an all-epitaxial multilayer sequence, such that: the layers are homoepitaxially grown on a freestanding GaN substrate in the case of blue emission or green emission. The layers are preferentially homoepitaxially grown on a GaAs substrate and are based on AlGaInP alloys in the case of red emission, but could also be based on AlInGaAs on GaAs or alternatively AlInGaN on GaN alloys. Moreover, the substrate is n-doped with a carrier concentration >1E17 cm-3 (or could alternatively be unintentionally doped or semi-insulating—see alternative embodiments below).

The semiconductor heterostructures are processed through standard process technology into devices having waveguiding structures (ridges), isolating dielectric layers, p- and n-electrode metallizations, and two chip end facets (mirrors). For LDs, one or both of the chip end facets may have dielectric coatings applied to them which have a specified reflectivity to define the laser's characteristics. For SLDs, the output facet may incorporate an anti-reflection coating to suppress lasing.

Below is a table summarising material choice options for the different epitaxial layers for the nitride and arsenide materials systems.

| Wavelength Range | 390-570 nm | 570-1150 nm |
|---|---|---|
| Substrate | GaN | GaAs |
| Cladding + Separation Layer(s) | $Al_xIn_yGa_{1-x-y}N$ | $Al_xGa_{1-x}As$ |
| | | $Al_xGa_yIn_{1-x-y}P$ |
| Waveguiding Layers | $In_xGa_{1-x}N$ | $Al_xGa_{1-x}As$ |
| | | $Al_xGa_yIn_{1-x-y}P$ |
| Active region layers (QWs + barriers) | $In_xGa_{1-x}N$ | $Al_xGa_yIn_{1-x-y}P$ |
| | | $Al_xGa_yIn_{1-x-y}As$ |
| | | $In_xGa_{1-x}As_{1-y}P_y$ |

These are the two materials systems used commercially for fabricating LDs and SLDs for display applications, i.e. for emission in the visible wavelength range.

In the left-hand column the label 'cladding' corresponds to the outer cladding layers 162, 121; and 'waveguide' the inner cladding layers 161, 122. The principal materials systems of choice for fabricating LDs and SLDs, as set out in the table are GaAlInN (sometimes referred to as GaN-based or nitride-based) for the wavelength range 390-570 nm, i.e. including blue and green, and GaAsP (sometimes referred to as GaAs-based or phosphide/arsenide-based) for the wavelength range 570-1150 nm, i.e. including green and red. For current commercial LDs and SLDs in the visible range, i.e. for display applications, GaAs(P)-based systems are predominantly used for red wavelengths and GaN-based systems for blue and green wavelengths.

Figures 9A, 9B:
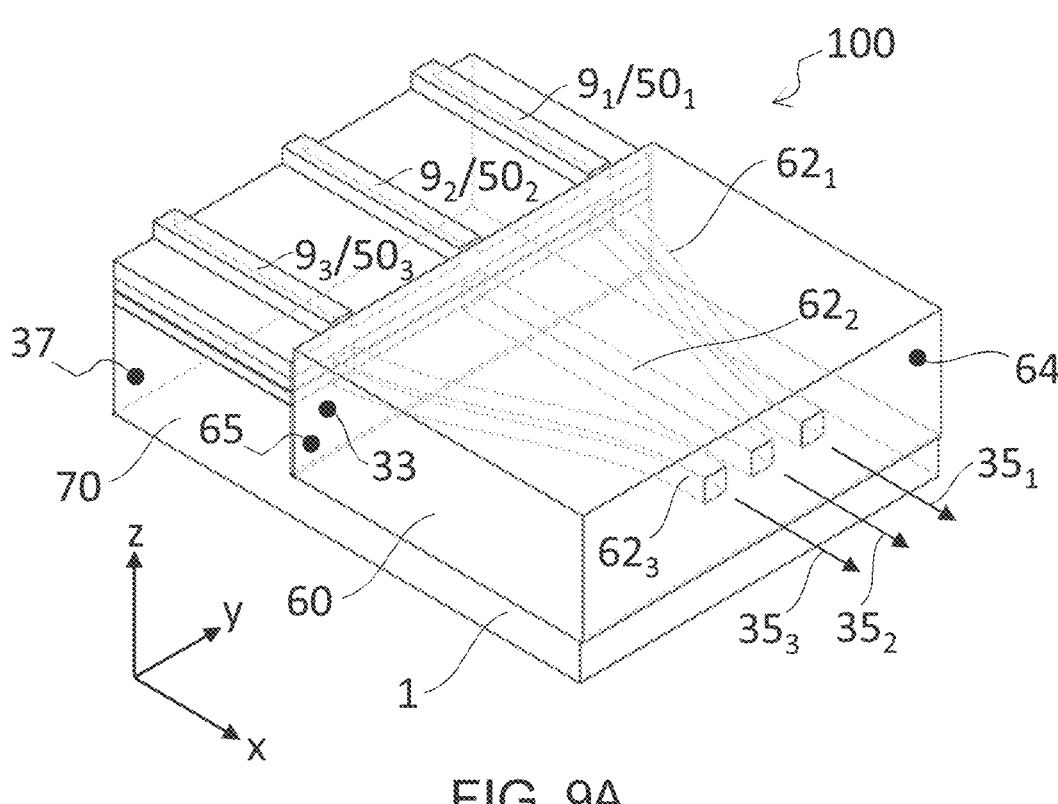
FIGS. 9A, 9B and 9C show a monolithic edge-emitting semiconductor diode array chip with photonic integrated circuit (PIC) according to an embodiment of the disclosure, respectively in perspective view, plan view and partial cut-away perspective view with the PIC removed.
Figure 9C:
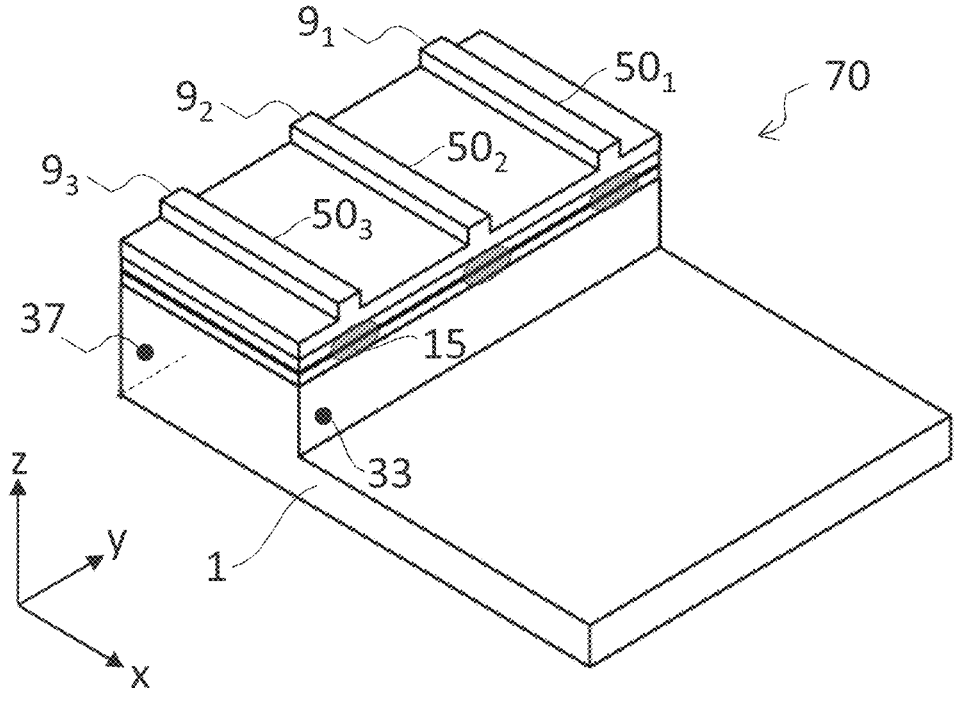

FIGS. 9A, 9B and 9C show a monolithic edge-emitting semiconductor diode array chip 100 which includes a photonic integrated circuit (PIC) 60 according to an embodiment of the disclosure. FIGS. 9A, 9B and 9C are respectively in perspective view, plan view and partial cut-away perspective view with the PIC removed.

The diode emitter array part 70 of the chip 100 is according to FIG. 6B, i.e. based on ridge waveguides one for each diode emitter 50_k. The ridges 9_k are shown as being straight and extending orthogonal to the front and back chip end facets 33, 37 of the diode emitter array part of the chip 100, as they would be for LDs. In the case of SLDs, the ridges 9_k could incorporate curved length portions and/or extend at a non-normal angle to one or both of the chip end facets 33, 37 to suppress lasing. The PIC 60 has front and back facets 64, 65 and is integrated into the chip 100 in order to accommodate passive waveguides 62_k (shown with dotted lines), one for each diode emitter 50_k, which serve to bring the output beams 35_k from the diode emitter array 70 (more specifically from respective edge-emitting semiconductor diode emitters 50_k with optical axes in the x-direction as shown with arrows) closer together before they are emitted from the chip 100. The output beams are divergent and may be characterized by a circular or an elliptical cross-section. The PIC 60 can, for example, be formed by etching away a suitable portion of the heterostructure, e.g. down to the substrate 1 (as shown in FIG. 9C), and then performing re-growth (combined with suitable etching) to deposit the dielectric layers and lateral structuring needed for the PIC 60, specifically to form the passive waveguides 62_k (i.e. to arrive at the structure shown in FIG. 9A). The PIC 60 can be constructed from a SiO2 matrix embedding the passive waveguides 62 whose cores are SiN. If etching and re-growth is used to form the PIC 60, then the output facet 33 for the diode emitter array 70 will be an etched facet (i.e. not a cleaved facet).

The passive waveguides 62_k are aligned both in height and laterally with the output beams 15 of the diode emitters 50_k so that the output beams from the diode emitters 50_k, shown in FIG. 9C through light emitting spots 15, are directly coupled into the ends of the respective passive waveguide 62 on the back PIC facet 65 with the minimum of losses. Fabrication may ensure that there is no gap between the output facet 33 of the diode emitters and the input facet 65 of the PIC 60. Alternatively, a small gap may be fabricated. In the case of a gap, this may be left open or may be infilled with a suitable transparent material, e.g., a suitable dielectric.

The output facet 64 for the chip 100, which is the output facet of the PIC 60 in this design, may be etched or cleaved. The diode emitters 50 are thus combined monolithically on the same chip with self-aligned passive waveguides 62 for bringing the output beams closer together before they are emitted from the chip. The PIC 60 thus acts as a beam concentrator.

Figure 10:
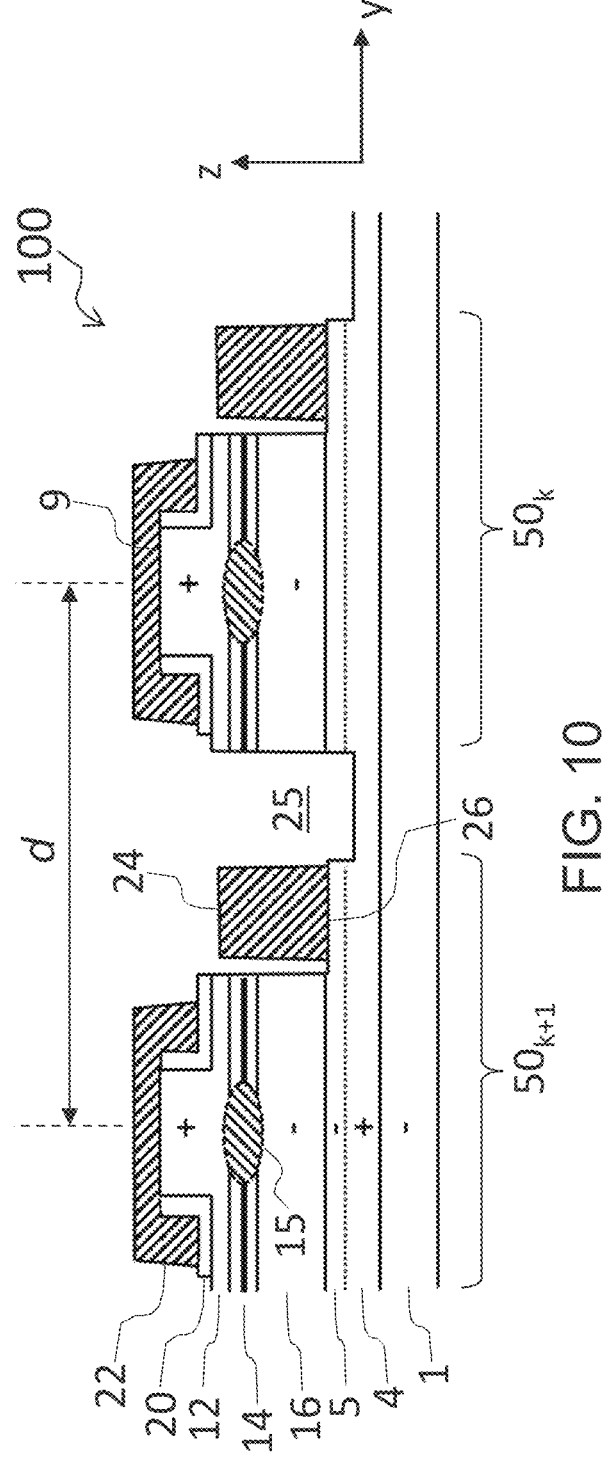
FIGS. 10 to 12 shows schematic sections of a diode array according to alternative embodiments.
Figure 11:
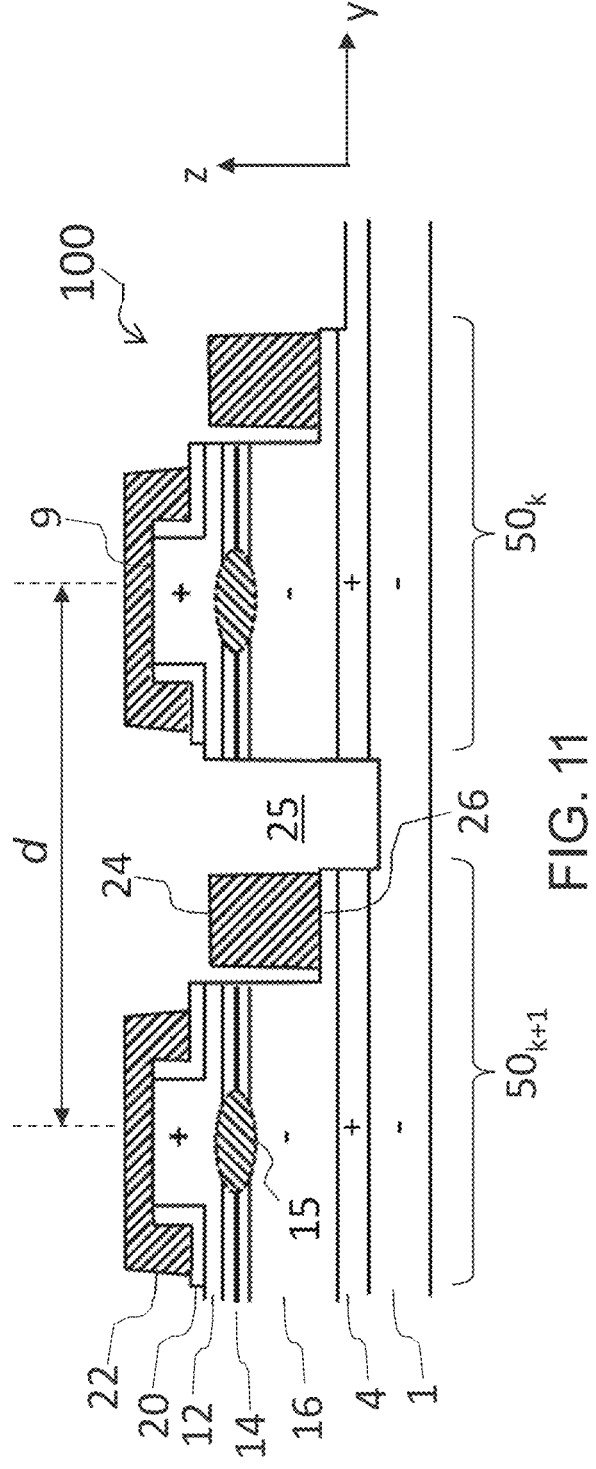
Figure 12:
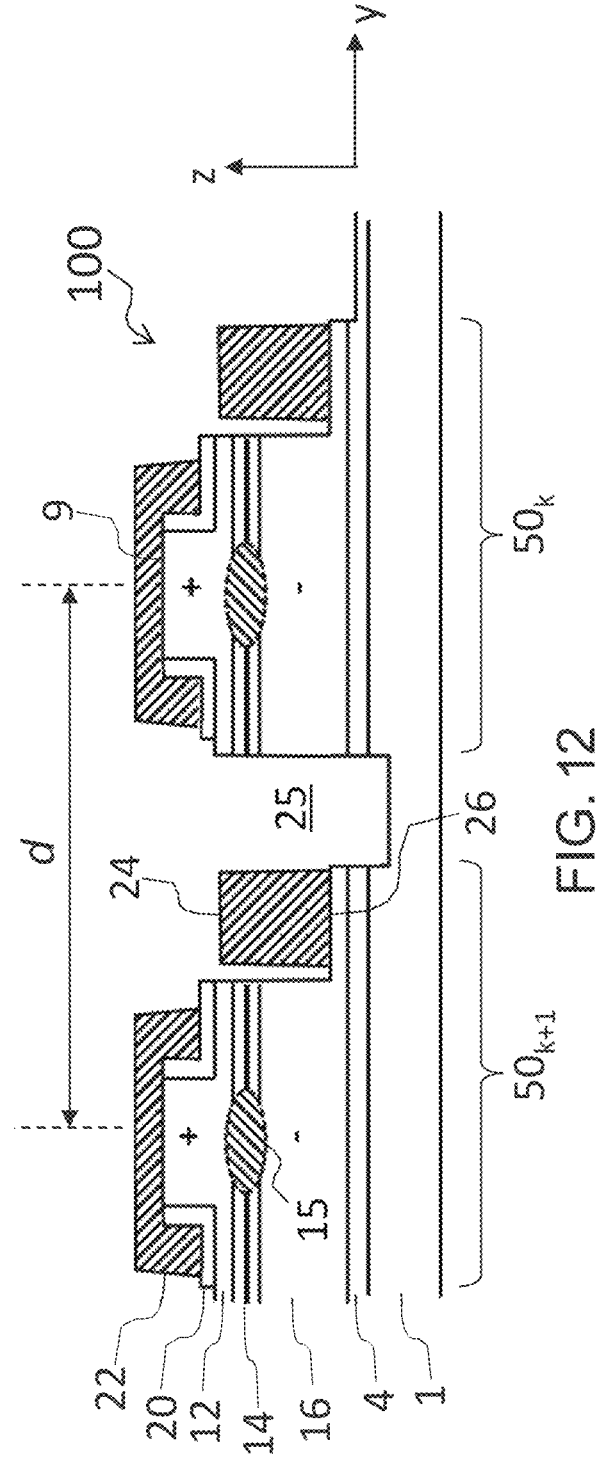

FIGS. 10 to 12 shows schematic sections of a diode array according to alternative embodiments which have different ways to electrically isolate adjacent diodes from each other. The same reference numerals are used as above. The pitch 'd' is shown, i.e. the lateral separation between the diode emitters. In addition, the charge state of the various heterostructure layers during operation, i.e. forward bias across the diode emitters, is indicated schematically with plus (+) and minus (−) symbols.

FIG. 10 shows an embodiment with a conductive substrate 1. This is illustrated as n-type, but could be p-type. The carrier concentration of a conductive substrate is typically ≥1E17 cm-3. The epitaxial structure includes a layer sequence of lower and upper separation layers 4, 5. The separation layers 4, 5 are positioned in the overall layer sequence between the conductive substrate 1 and the device structure layers 16, 14, 12 etc. Assuming use of an n-type conductive substrate 1, the upper separation layer 5 may be heavily doped n-type, i.e. n+, e.g. with a doping level ≥1E18 cm-3, and the lower separation layer 4 is p-type doped with a low doping concentration, e.g. ≤1E17 cm-3 (or alternatively resistive). The trenches 25 are etched so that their bases lie at a depth that is below the base of the upper separation layer 5 within or below the depth of the lower separation layer 4. The heavily doped upper separation layer 5 serves to provide a low resistance ohmic junction to the metallic anode pads 24, since it allows the surface 26 to be formed by highly doped material, i.e. either at a height lying within the highly doped upper separation layer 5, or at the top of the highly doped upper separation layer 5 where it interfaces with the lower outer cladding layer 162.

FIG. 11 shows another embodiment with a conductive substrate 1. A separation layer 4 is provided that is oppositely doped to the substrate, i.e. a separation layer made of a single p-type (alternatively n-type) layer with a low dopant concentration in combination with an n-type (alternatively p-type) conductive substrate. The trenches 25 are etched so that their bases lie at a depth that is either below the base of the doped separation layer 4 (as illustrated) or within the doped separation layer 4. The opposite doping types of the conductive substrate 1 and separation layer 4 results in a reverse polarity junction being formed between the diode emitter layers 3 and the substrate 1 when a diode emitter is forward biased for emission, thereby inhibiting current flow between adjacent diode emitters.

FIG. 12 shows another embodiment with a conductive substrate 1. The conductive substrate may be n-type or p-type. A separation layer 4 is provided which is resistive. The trenches 25 are etched so that their bases lie at a depth that is either below the base of the resistive separation layer 4 (as illustrated) or within the resistive separation layer 4. The resistive separation layer 4 could be fabricated by growing an undoped layer, or could be achieved by growing a layer that is intentionally doped with an atomic species such as Carbon in nitride-based compounds that results in a resistive material.

Figure 13:
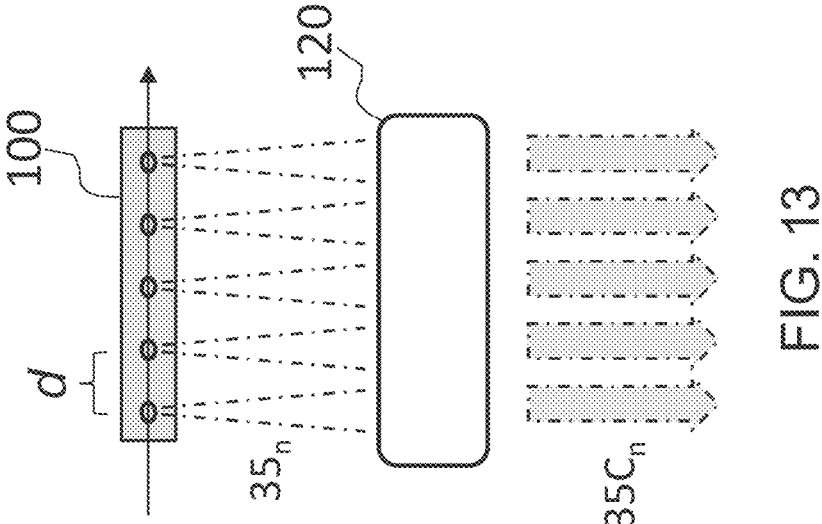
FIG. 13 is a schematic illustration of a light emitting module for a monochrome display projector.

FIG. 13 is a schematic illustration of a light emitting module for a monochrome display projector of a diode array chip 100 as described above in combination with suitable collimation optics 120 for transforming the divergent output beams 35_$k$ into a corresponding set of collimated beams 35C_k. The diode array chip accommodates a linear, i.e. 1D, array of emitters (five are illustrated by way of example). The diode emitters can all emit at the same emission wavelength, i.e. have the same color. In other words, a common heterostructure can be used for all the diode emitters. The diode emitters are separated by a constant pitch although an irregular spacing is possible. The collimating optics 120 may be implemented by individual lens and/or mirror combinations or by a suitable microlens array. The collimating optics may, for example, be provided in a stand-alone unit separate from the chip as schematically illustrated or integrated onto the chip by forming or bonding suitable micro-optical components, e.g. lenses, directly onto the output facet of the chip, which is facet 33 in the case of a design with no PIC and 64 in the case of a design with a PIC 60. Collimating optics may be based on one of the following alternatives:

A high numerical aperture (NA) lens to generate a set of independent output beams from the multiple emitters that will be slightly tilted in the respective direction. Alternatively, beam quality may potentially be improved through the use of multiple lenses (e.g. with a high numerical aperture lens for fast-axis and a lower numerical aperture lens for slow axis collimation).

Micro-lens arrays tailored to the multi-emitter array structure and aligned in front of the chip emitting spot Micro-optics directly deposited and micro-machined on the light emitting output facet of the chip A beam concentrator PIC as discussed above together with microlens arrays or micro-optics.

In summary, the collimating optics serve 120 to transform the divergent output beams 35 output from the chip 100 into a plurality of collimated output beams 39C as is known in the art.

Figure 14:
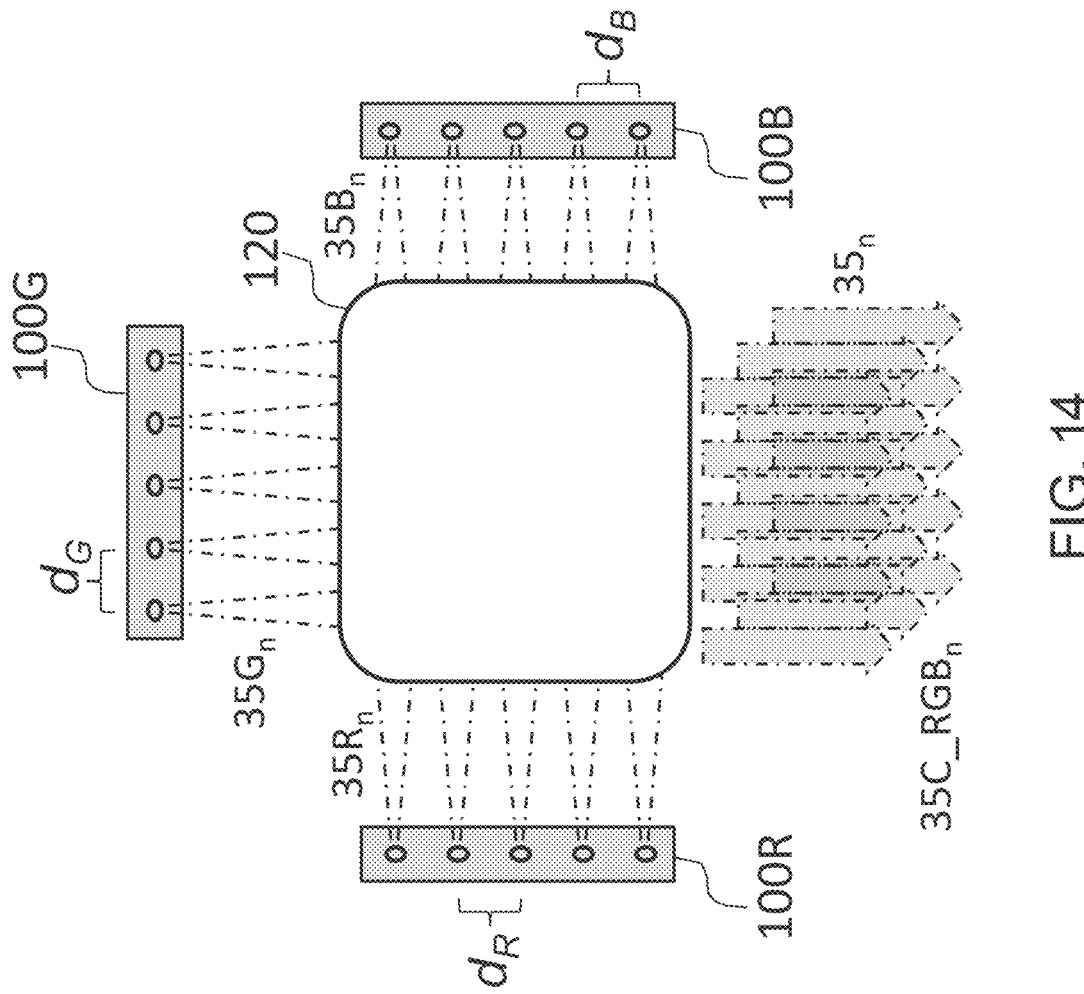
FIG. 14 is a schematic illustration of a light emitting module for a color display projector.

FIG. 14 is a schematic illustration of a light emitting module for a color display projector incorporating three diode array chips 100R, 100G, 100B as described above, one for each of red, green and blue, in combination with a suitable collimation and combining unit 120 for transforming the three sets of divergent output beams 35R, 35G, 39B from the three diode array chips into three sets of collimated output beams 39C_RGB which are all propagating in the same direction, i.e. parallel to each other, as illustrated.

Figure 15:
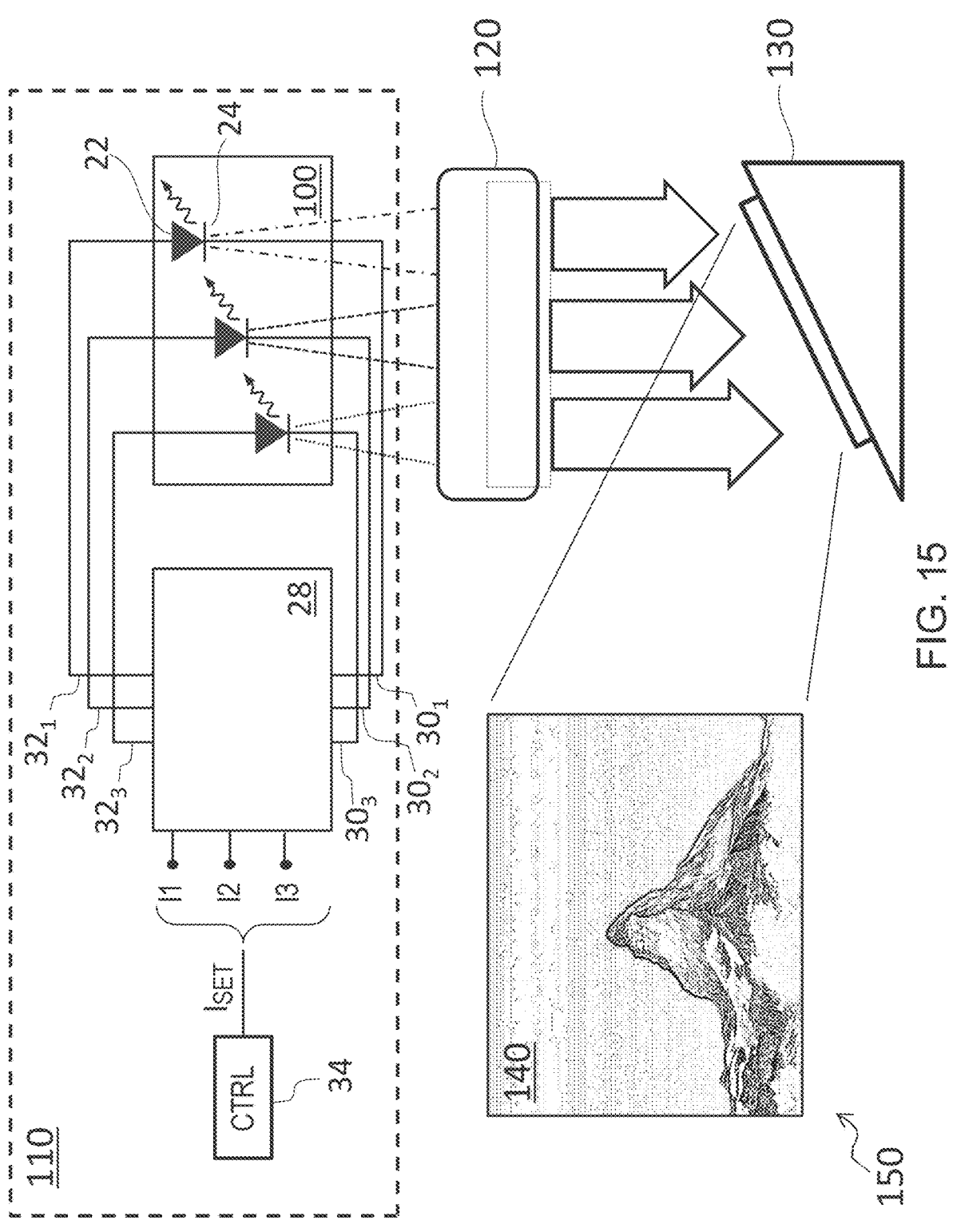
FIG. 15 is a schematic illustration of a display projector.

FIG. 15 is a schematic illustration of a display projector 150 which incorporates a light emitting module 110 as shown in FIG. 6B with a collimation unit 120 as shown in FIG. 13 or FIG. 14 and a beam scanning unit 130 for rastering the output beams to form an image 140. The beam scanning unit 140 may be based on a MEMS light engine.

Figure 16:
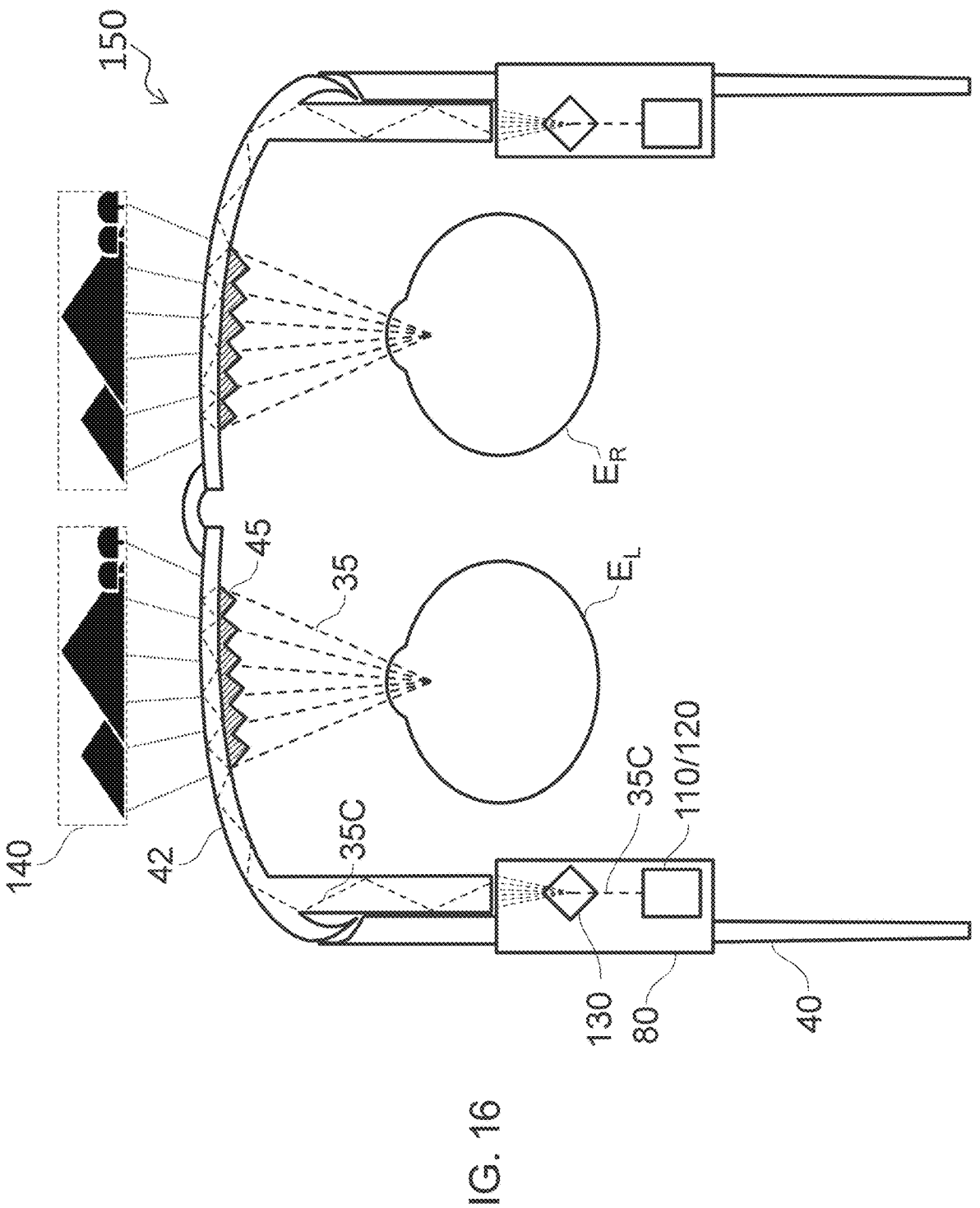
FIG. 16 shows an example near-to eye projection system incorporated in a vision system having a spectacles format.

FIG. 16 shows an example near-to-eye display projector 150 incorporated in a vision system having a spectacles format. A housing 80 is integrated midway along each temple (i.e. arm) 40 and houses a light emitting module 110 and collimation unit 120 as shown in FIG. 15. The combined RGB output beam 35 emitted from the light emitting module 110 and collimation unit 120 is directed to a beam scanning unit 130 which projects and couple the output beam 35 into a waveguide lens 42. The guided light beam is then extracted under the form of a virtual image 140 in front of a wearer's eye, i.e. the left eye EL or the right eye ER, through an outcoupling element 45. Projection in front of both eyes allows for additional imaging possibilities, such as stereoscopic imaging for 3D. The display projector 150 can thus be incorporated into glasses, spectacles or other head-mountable unit.

It will be clear to one skilled in the art that many improvements and modifications can be made to the foregoing exemplary embodiments without departing from the scope of the present disclosure.

What is claimed is:

1. A monolithic edge-emitting semiconductor diode array chip comprising:

a conductive substrate;

a plurality of semiconductor layers arranged on the conductive substrate, the semiconductor layers including
   one or more active region layers sandwiched between upper and lower cladding layers; and
   one or more separation layers arranged between the conductive substrate and the lower cladding layer, front and back chip facets;

a plurality of ridges, each extending between the front and back chip facets and each having respective pairs of sides that define a waveguide in the active region layers, wherein the front chip facet defines an output coupling termination for the waveguides;

a trench extending between each pair of adjacent ridges, each trench having a base lying at a depth that is within or below the one or more separation layers; and a one-dimensional array of diodes, which are laser diodes, superluminescent diodes or semiconductor optical amplifiers, each diode having a gain region defined by one of the waveguides in combination with the active region layers and each being configured to emit an output beam from the front chip facet when driven under forward bias, wherein each diode of the one-dimensional array has its own upper and lower contacts that are arranged to contact the semiconductor layers above and below the active region layers so that each diode is independently drivable, wherein the upper and lower contacts form anode and cathode diode contacts to respective ones of the diodes or vice versa.

2. The chip of claim 1, wherein, for each diode, its upper contact is arranged to form an ohmic electrical connection with the upper cladding layer and its lower contact is arranged to form an ohmic electrical connection with the lower cladding layer.

3. The chip of claim 1, wherein the one or more separation layers comprise lower and upper separation layers, the lower separation layer being undoped or oppositely doped to the substrate and the upper separation layer being doped in the same sign as the substrate and the lower cladding layer, and each trench having a base lying at a depth that is below the upper separation layer.

4. The chip of claim 1, wherein the one or more separation layers comprise a separation layer that is oppositely doped to the substrate, and each trench has a base lying at a depth that is either below the base of the oppositely doped separation layer or within the oppositely doped separation layer.

5. The chip of claim 1, wherein the one or more separation layers comprise a separation layer that is resistive, and each trench has a base lying at a depth that is either below the base of the resistive separation layer or within the resistive separation layer.

6. The chip of claim 1, further comprising a photonic integrated circuit, PIC, formed monolithically on the substrate with the diode array and having front and back PIC facets, the PIC having a plurality of passive waveguides embedded therein, the back PIC facet facing the front chip facet of the diode array such that input ends of ones of the passive waveguides on the back PIC facet are aligned with the diode waveguide terminations on the front chip facet so as to receive and passively waveguide the output beams from the diode emitters to the front PIC facet for output from the chip.

7. The chip of claim 6, wherein the front chip facet is formed by etching, said etching also removing an area of the semiconductor layers, wherein the PIC is formed on the substrate by re-growth over the area removed by said etching.

8. The chip of claim 6, wherein one or more of the passive waveguides are curved so as to bring the output beams at the front PIC facet closer together than the output beams at the front chip facet.

9. The chip of claim 6, wherein two or more of the passive waveguides are arranged to act as couplers to superimpose multiple ones of the output beams at the front chip facet into a combined beam at the front PIC facet.

10. A light emitting module comprising a monolithic edge-emitting semiconductor diode array chip and a driver unit comprising a plurality of driver circuits, wherein the monolithic edge-emitting semiconductor diode array chip comprises a conductive substrate;

a plurality of semiconductor layers arranged on the conductive substrate, the semiconductor layers including one or more active region layers sandwiched between upper and lower cladding layers; and one or more separation layers arranged between the conductive substrate and the lower cladding layer, front and back chip facets;

a plurality of ridges, each extending between the front and back chip facets and each having respective pairs of sides that define a waveguide in the active region layers, wherein the front chip facet defines an output coupling termination for the waveguides;

a trench extending between each pair of adjacent ridges, each trench having a base lying at a depth that is within or below the one or more separation layers; and a one-dimensional array of diodes, which are laser diodes, superluminescent diodes or semiconductor optical amplifiers, each diode having a gain region defined by one of the waveguides in combination with the active region layers and each being configured to emit an output beam from the front chip facet when driven under forward bias, wherein each diode of the one-dimensional array has its own upper and lower contacts that are arranged to contact the semiconductor layers above and below the active region layers so that each diode is independently drivable, wherein the upper and lower contacts form anode and cathode diode contacts to respective ones of the diodes or vice versa, and wherein the driver circuits are connected across the anode and cathode contacts of respective diodes of the monolithic edge-emitting semiconductor diode array chip.

11. The light emitting module of claim 10, wherein each driver circuit comprises a current source connected to push a modulated push current through its associated diode and/or a current sink connected to extract a modulated pull current through its associated diode.

12. The light emitting module of claim 10, wherein each driver circuit further comprises a biasing current source connected to apply a DC bias current across its associated diode to which is added the push current and from which is subtracted the pull current.

13. A display projector module comprising:

a light emitting module comprising a monolithic edge-emitting semiconductor diode array chip and a driver unit comprising a plurality of driver circuits, wherein the monolithic edge-emitting semiconductor diode array chip comprises:

a conductive substrate;

a plurality of semiconductor layers arranged on the conductive substrate, the semiconductor layers including one or more active region layers sandwiched between upper and lower cladding layers; and one or more separation layers arranged between the conductive substrate and the lower cladding layer, front and back chip facets;

a plurality of ridges, each extending between the front and back chip facets and each having respective pairs of sides that define a waveguide in the active region layers, wherein the front chip facet defines an output coupling termination for the waveguides;

a trench extending between each pair of adjacent ridges, each trench having a base lying at a depth that is within or below the one or more separation layers; and a one-dimensional array of diodes, which are laser diodes, superluminescent diodes or semiconductor optical amplifiers, each diode having a gain region defined by one of the waveguides in combination with the active region layers and each being configured to emit an output beam from the front chip facet when driven under forward bias, wherein each diode of the one-dimensional array has its own upper and lower contacts that are arranged to contact the semiconductor layers above and below the active region layers so that each diode is independently drivable, wherein the upper and lower contacts form anode and cathode diode contacts to respective ones of the diodes or vice versa, and wherein the driver circuits are connected across the anode and cathode contacts of respective diodes of the monolithic edge-emitting semiconductor diode array chip, and the display projector module further comprises:

collimating optics configured to transform the output beams output from the chip into a plurality of collimated output beams; and a beam scanner for raster scanning the output beams to form an image.

14. A vision system configured to be placed on a human head incorporating a display projector module into a head-mountable unit, the display projector module comprising:

a light emitting module comprising a monolithic edge-emitting semiconductor diode array chip and a driver unit comprising a plurality of driver circuits, wherein the monolithic edge-emitting semiconductor diode array chip comprises:

a conductive substrate;

a plurality of semiconductor layers arranged on the conductive substrate, the semiconductor layers including one or more active region layers sandwiched between upper and lower cladding layers; and one or more separation layers arranged between the conductive substrate and the lower cladding layer, front and back chip facets;

a plurality of ridges, each extending between the front and back chip facets and each having respective pairs of sides that define a waveguide in the active region layers, wherein the front chip facet defines an output coupling termination for the waveguides;

a trench extending between each pair of adjacent ridges, each trench having a base lying at a depth that is within or below the one or more separation layers; and a one-dimensional array of diodes, which are laser diodes, superluminescent diodes or semiconductor optical amplifiers, each diode having a gain region defined by one of the waveguides in combination with the active region layers and each being configured to emit an output beam from the front chip facet when driven under forward bias, wherein each diode of the one-dimensional array has its own upper and lower contacts that are arranged to contact the semiconductor layers above and below the active region layers so that each diode is independently drivable, wherein the upper and lower contacts form anode and cathode diode contacts to respective ones of the diodes or vice versa, and wherein the driver circuits are connected across the anode and cathode contacts of respective diodes of the monolithic edge-emitting semiconductor diode array chip, and the display projector module further comprises:

collimating optics configured to transform the output beams output from the chip into a plurality of collimated output beams; and a beam scanner for raster scanning the output beams to form an image.

15. The chip of claim 4, further comprising a further separation layer arranged above said separation layer, the further separation layer being doped in the same sign as the substrate and the lower cladding layer.

16. The chip of claim 1, where the substrate in GaN and at least two of the plurality of semiconductor layers are GaAlInN.

17. The chip of claim 1, where the substrate is one of a c-plane free-standing GaN and a GaN substrate having one of a non-polar and semi-polar orientation.

* * * * *